(12) United States Patent
Gatabi et al.

(10) Patent No.: US 12,015,386 B2
(45) Date of Patent: Jun. 18, 2024

(54) LOGARITHMIC DEMODULATOR FOR LASER WAVELENGTH-MODULATON SPECTROSCOPY

(71) Applicant: SeekOps Inc., Austin, TX (US)

(72) Inventors: Javad Rezanezhad Gatabi, Austin, TX (US); Brendan James Smith, Lakeway, TX (US)

(73) Assignee: SeekOps Inc., Austin, TX (US)

( * ) Notice: Subject to any disclaimer, the term of this patent is extended or adjusted under 35 U.S.C. 154(b) by 0 days.

(21) Appl. No.: 17/913,811

(22) PCT Filed: Mar. 25, 2021

(86) PCT No.: PCT/US2021/024177
§ 371 (c)(1),
(2) Date: Sep. 22, 2022

(87) PCT Pub. No.: WO2021/195394
PCT Pub. Date: Sep. 30, 2021

(65) Prior Publication Data
US 2023/0353128 A1    Nov. 2, 2023

Related U.S. Application Data

(60) Provisional application No. 62/994,680, filed on Mar. 25, 2020.

(51) Int. Cl.
*G06G 7/24* (2006.01)
*H03H 11/12* (2006.01)
*H03H 11/04* (2006.01)

(52) U.S. Cl.
CPC ..... *H03H 11/1291* (2013.01); *H03H 11/1221* (2013.01); *H03H 2011/0494* (2013.01)

(58) Field of Classification Search
CPC ............................ G06G 7/24; H03H 11/1291
See application file for complete search history.

(56) References Cited

U.S. PATENT DOCUMENTS

| | | | |
|---|---|---|---|
| 3,780,566 A | 12/1973 | Smith et al. | |
| 4,135,092 A | 1/1979 | Milly | |

(Continued)

FOREIGN PATENT DOCUMENTS

| | | | |
|---|---|---|---|
| AU | 3401499 A | 11/1999 | |
| CN | 104458588 A | 3/2015 | |

(Continued)

OTHER PUBLICATIONS

U.S. Appl. No. 62/687,147, Issue Date Jun. 19, 2018, Brendan James Smith.

(Continued)

*Primary Examiner* — Patrick O Neill
(74) *Attorney, Agent, or Firm* — Concept IP LLP; Michael Zarrabian

(57) ABSTRACT

Systems, devices, and methods including a first band-pass filter configured to receive and filter a detector signal, where the first band-pass filter has a central frequency of 2f; a second band-pass filter configured to receive and filter the detector signal where the second band-pass filter has a central frequency of 1f; a first logarithmic amplifier (Log Amp) configured to apply the filtered detector signal from the first band-pass filter; a second Log Amp configured to apply the filtered detector signal from the second band-pass filter; a differential amplifier configured to subtract the applied signal from the first Log Amp from the applied signal from the second Log Amp; and an Anti-Log Amplifier configured to determine an inverse logarithm of the subtracted signal from the differential amplifier.

20 Claims, 23 Drawing Sheets

(56) References Cited

U.S. PATENT DOCUMENTS

| | | |
|---|---|---|
| 4,233,564 A | 11/1980 | Kerbel |
| 4,507,558 A | 3/1985 | Bonne |
| 4,988,833 A | 1/1991 | Lai |
| 5,047,639 A | 9/1991 | Wong |
| 5,075,619 A | 12/1991 | Said |
| 5,173,749 A | 12/1992 | Tell et al. |
| 5,291,265 A | 3/1994 | Kebabian |
| 5,317,156 A | 5/1994 | Cooper et al. |
| 5,822,058 A | 10/1998 | Adler-Golden et al. |
| 6,064,488 A | 5/2000 | Brand et al. |
| 6,509,566 B1 | 1/2003 | Wamsley et al. |
| 6,549,630 B1 | 4/2003 | Bobisuthi |
| 7,800,751 B1 | 9/2010 | Silver et al. |
| 7,833,480 B2 | 11/2010 | Blazewicz et al. |
| 8,294,899 B2 | 10/2012 | Wong |
| 8,451,120 B2 | 5/2013 | Johnson, Jr. et al. |
| 8,730,461 B2 | 5/2014 | Andreussi |
| 9,183,371 B2 | 11/2015 | Narendra et al. |
| 9,183,731 B1 | 11/2015 | Bokhary |
| 9,235,974 B2 | 1/2016 | Johnson, Jr. et al. |
| 9,250,175 B1 | 2/2016 | McManus |
| 9,494,511 B2 | 11/2016 | Wilkins |
| 9,599,529 B1 | 3/2017 | Steele et al. |
| 9,599,597 B1 | 3/2017 | Steele et al. |
| 10,023,311 B2 | 7/2018 | Lai et al. |
| 10,023,323 B1 | 7/2018 | Roberts et al. |
| 10,126,200 B1 | 11/2018 | Steele et al. |
| 10,268,198 B2 | 4/2019 | Mantripragada et al. |
| 10,325,485 B1 | 6/2019 | Schuster |
| 10,365,646 B1 | 7/2019 | Farnsworth et al. |
| 10,429,546 B1 | 10/2019 | Ulmer |
| 10,830,034 B2 | 11/2020 | Cooley et al. |
| 10,962,437 B1 | 3/2021 | Nottrott et al. |
| 11,299,268 B2 | 4/2022 | Christensen et al. |
| 11,519,855 B2 | 12/2022 | Black et al. |
| 2002/0005955 A1 | 1/2002 | Kramer et al. |
| 2003/0160174 A1 | 8/2003 | Grant et al. |
| 2003/0189711 A1 | 10/2003 | Orr et al. |
| 2003/0230716 A1 | 12/2003 | Russell et al. |
| 2004/0012787 A1 | 1/2004 | Galle et al. |
| 2004/0017762 A1 | 1/2004 | Sogawa et al. |
| 2004/0212804 A1 | 10/2004 | Neff et al. |
| 2006/0015290 A1 | 1/2006 | Warburton et al. |
| 2006/0044562 A1 | 3/2006 | Hagene et al. |
| 2006/0232772 A1 | 10/2006 | Silver |
| 2006/0234621 A1 | 10/2006 | Desrochers et al. |
| 2007/0137318 A1 | 6/2007 | Desrochers et al. |
| 2008/0169934 A1 | 7/2008 | Lang et al. |
| 2008/0243372 A1 | 10/2008 | Bodin et al. |
| 2009/0201507 A1 | 8/2009 | Kluczynski et al. |
| 2009/0263286 A1 | 10/2009 | Isomura et al. |
| 2009/0326792 A1 | 12/2009 | McGrath |
| 2010/0004798 A1 | 1/2010 | Bodin et al. |
| 2010/0131207 A1 | 5/2010 | Lippert et al. |
| 2010/0140478 A1 | 6/2010 | Wilson et al. |
| 2010/0147081 A1 | 6/2010 | Thomas |
| 2011/0074476 A1 | 3/2011 | Heer et al. |
| 2011/0150035 A1 | 6/2011 | Hanson et al. |
| 2011/0164251 A1 | 7/2011 | Richter |
| 2011/0242659 A1 | 10/2011 | Eckles et al. |
| 2011/0257944 A1 | 10/2011 | Du et al. |
| 2012/0120397 A1 | 5/2012 | Furtaw et al. |
| 2013/0044314 A1 | 2/2013 | Koulikov et al. |
| 2013/0076900 A1 | 3/2013 | Mrozek et al. |
| 2013/0208262 A1 | 8/2013 | Andreussi |
| 2014/0172323 A1 | 6/2014 | Marino |
| 2014/0204382 A1 | 7/2014 | Christensen |
| 2014/0236390 A1 | 8/2014 | Mohamadi |
| 2014/0336957 A1 | 11/2014 | Hanson et al. |
| 2015/0072633 A1* | 3/2015 | Massarella .......... G01S 7/021 455/214 |
| 2015/0275114 A1 | 10/2015 | Tumiatti et al. |
| 2015/0295543 A1 | 10/2015 | Brown et al. |
| 2015/0316473 A1 | 11/2015 | Kester et al. |
| 2016/0018373 A1 | 1/2016 | Pagé et al. |
| 2016/0104250 A1 | 4/2016 | Allen et al. |
| 2016/0146696 A1 | 5/2016 | Steele et al. |
| 2016/0161456 A1 | 6/2016 | Risk et al. |
| 2016/0202225 A1 | 7/2016 | Feng et al. |
| 2016/0214715 A1 | 7/2016 | Meffert |
| 2016/0307447 A1 | 10/2016 | Johnson et al. |
| 2016/0357192 A1 | 12/2016 | McGrew et al. |
| 2017/0003684 A1 | 1/2017 | Knudsen |
| 2017/0057081 A1 | 3/2017 | Krohne et al. |
| 2017/0089829 A1 | 3/2017 | Bartholomew et al. |
| 2017/0093122 A1 | 3/2017 | Bean et al. |
| 2017/0097274 A1 | 4/2017 | Thorpe et al. |
| 2017/0115218 A1 | 4/2017 | Huang et al. |
| 2017/0134497 A1 | 5/2017 | Harter et al. |
| 2017/0158353 A1 | 6/2017 | Schmick |
| 2017/0199647 A1 | 7/2017 | Richman et al. |
| 2017/0206648 A1 | 7/2017 | Marra et al. |
| 2017/0235018 A1 | 8/2017 | Foster et al. |
| 2017/0259920 A1 | 9/2017 | Lai et al. |
| 2017/0307519 A1 | 10/2017 | Black et al. |
| 2017/0336281 A1 | 11/2017 | Waxman et al. |
| 2017/0339820 A1 | 11/2017 | Foster et al. |
| 2018/0023974 A1 | 1/2018 | Otani et al. |
| 2018/0045561 A1 | 2/2018 | Leen et al. |
| 2018/0045596 A1 | 2/2018 | Prasad et al. |
| 2018/0050798 A1 | 2/2018 | Kapuria |
| 2018/0059003 A1 | 3/2018 | Jourdainne |
| 2018/0067066 A1 | 3/2018 | Giedd et al. |
| 2018/0109767 A1 | 4/2018 | Li et al. |
| 2018/0127093 A1 | 5/2018 | Christensen et al. |
| 2018/0188129 A1 | 7/2018 | Choudhury et al. |
| 2018/0209902 A1 | 7/2018 | Myshak et al. |
| 2018/0259955 A1 | 9/2018 | Noto |
| 2018/0266241 A1 | 9/2018 | Ferguson et al. |
| 2018/0266946 A1 | 9/2018 | Kotidis et al. |
| 2018/0284088 A1 | 10/2018 | Verbeck, IV |
| 2018/0292374 A1 | 10/2018 | Dittberner et al. |
| 2018/0321692 A1 | 11/2018 | Castillo-Effen et al. |
| 2018/0322699 A1 | 11/2018 | Gray et al. |
| 2019/0011920 A1 | 1/2019 | Heinonen et al. |
| 2019/0011935 A1 | 1/2019 | Ham et al. |
| 2019/0025199 A1 | 1/2019 | Koulikov |
| 2019/0033194 A1 | 1/2019 | DeFreez et al. |
| 2019/0049364 A1 | 2/2019 | Rubin |
| 2019/0077506 A1 | 3/2019 | Shaw et al. |
| 2019/0086202 A1 | 3/2019 | Guan et al. |
| 2019/0095687 A1 | 3/2019 | Shaw et al. |
| 2019/0154874 A1 | 5/2019 | Shams et al. |
| 2019/0178743 A1 | 6/2019 | McNeil |
| 2019/0195789 A1 | 6/2019 | Pan et al. |
| 2019/0204189 A1 | 7/2019 | Mohr, Jr. et al. |
| 2019/0212419 A1 | 7/2019 | Jeong et al. |
| 2019/0220019 A1 | 7/2019 | Tan et al. |
| 2019/0228573 A1 | 7/2019 | Sen et al. |
| 2019/0234868 A1 | 8/2019 | Tanomura et al. |
| 2019/0331652 A1 | 10/2019 | Ba et al. |
| 2020/0109976 A1 | 4/2020 | Ajay et al. |
| 2020/0249092 A1 | 8/2020 | Podmore et al. |
| 2020/0400635 A1 | 12/2020 | Potyrailo et al. |
| 2021/0017926 A1 | 1/2021 | Alkadi et al. |
| 2021/0109074 A1 | 4/2021 | Smith et al. |
| 2021/0140934 A1 | 5/2021 | Smith et al. |
| 2021/0190745 A1 | 6/2021 | Buckingham et al. |
| 2021/0190918 A1 | 6/2021 | Li et al. |
| 2021/0199565 A1 | 7/2021 | John et al. |
| 2021/0247369 A1 | 8/2021 | Nottrott et al. |
| 2021/0255158 A1 | 8/2021 | Smith et al. |
| 2021/0300591 A1 | 9/2021 | Tian |
| 2021/0321174 A1 | 10/2021 | Sun et al. |
| 2021/0364427 A1 | 11/2021 | Smith et al. |
| 2021/0382475 A1 | 12/2021 | Smith et al. |
| 2022/0113290 A1 | 4/2022 | Smith et al. |
| 2022/0268952 A1 | 8/2022 | Liang et al. |

(56) References Cited

U.S. PATENT DOCUMENTS

| | | | |
|---|---|---|---|
| 2022/0341806 A1 | 10/2022 | Miller et al. | |
| 2023/0194487 A1 | 6/2023 | Buckingham et al. | |

FOREIGN PATENT DOCUMENTS

| | | |
|---|---|---|
| CN | 205749271 U | 11/2016 |
| CN | 106769977 A | 5/2017 |
| CN | 107703075 A | 2/2018 |
| CN | 109780452 A | 5/2019 |
| CN | 211508182 U | 9/2020 |
| CN | 112213443 A | 1/2021 |
| DE | 29601472 U1 | 5/1996 |
| DE | 69333010 | 4/2004 |
| DE | 102014013822 A1 | 3/2016 |
| EP | 1371962 B1 | 7/2011 |
| FR | 3047073 B1 | 8/2019 |
| GB | 2538563 A | 11/2016 |
| JP | 200975823 A | 4/2009 |
| KR | 20170062813 A | 6/2017 |
| KR | 101770254 B1 | 8/2017 |
| TW | 522226 B | 3/2003 |
| WO | 1999054700 A2 | 10/1999 |
| WO | 02066950 A1 | 8/2002 |
| WO | 2008021311 A2 | 2/2008 |
| WO | 2015073687 A1 | 5/2015 |
| WO | 2016045791 A1 | 3/2016 |
| WO | 2016162673 A1 | 10/2016 |
| WO | 2017069979 A1 | 4/2017 |
| WO | 2018121478 A1 | 7/2018 |
| WO | 2018227153 A1 | 12/2018 |
| WO | 2019246280 A1 | 12/2019 |
| WO | 2020007684 A1 | 1/2020 |
| WO | 2020028353 A1 | 2/2020 |
| WO | 2020086499 A1 | 4/2020 |
| WO | 2020206006 A1 | 10/2020 |
| WO | 2020206020 A1 | 10/2020 |
| WO | 2021055902 A1 | 3/2021 |
| WO | 2021158916 A1 | 8/2021 |
| WO | 2022093864 A1 | 5/2022 |
| WO | 2022211837 A1 | 10/2022 |

OTHER PUBLICATIONS

"Safesite Multi-Threat Detection System", Jul. 11, 2012 (Jul. 11, 2012), pp. 1-6, XP055245980.
International Search Report and Written Opinion for PCT/US19/38011 dated Sep. 9, 2019.
International Search Report and Written Opinion for PCT/US19/38015, dated Oct. 18, 2019.
International Search Report and Written Opinion for PCT/US19/44119, dated Oct. 17, 2019.
International Search Report and Written Opinion for PCT/US20/26228 dated Jul. 1, 2020.
International Search Report and Written Opinion for PCT/US20/26232 dated Jun. 26, 2020.
International Search Report and Written Opinion for PCT/US20/26246 dated Jun. 29, 2020.
International Search Report and Written Opinion for PCT/US20/51696, dated Feb. 3, 2021.
International Search Report and Written Opinion for PCT/US2020/044978, dated Oct. 26, 2020.
International Search Report and Written Opinion for PCT/US2021/016821 dated Apr. 26, 2021.
International Search Report and Written Opinion for PCT/US2021/024177, dated Jun. 23, 2021.
International Search Report and Written Opinion for PCT/US2021/056708, dated Jan. 27, 2022.
International Search Report and Written Opinion for PCT/US21/42061, dated Nov. 26, 2021.
International Search Report and Written Opinion for PCT/US21/44532, dated Jan. 11, 2022.
International Search Report and Written Opinion for PCT/US21/56710, dated Feb. 23, 2022.
International Search Report and Written Opinion of PCT/US19/57305, dated Jan. 2, 2020.
International Search Report and Written Opinion of PCT/US20/54117, dated Dec. 22, 2020.
Joly, "Atmospheric Measurements by Ultra-Light Spectrometer (AMULSE) Dedicated to Vertical Profile In Situ Measurements of Carbon Dioxide ($CO_2$) Under Weather Balloons: Instrumental Development and Field Application," Sensors 2016, 16, 1609.
Khan, "Low Power Greenhouse Gas Sensors for Unmanned Aerial Vehicles", Remote Snse. 2012, 4, 1355-1368.
Villa. "An Overview of Small Unmanned Aerial Vehicles for Air Quality Measurements: Present Applications and Future Prospectives". Sensors. Web . Jul. 12, 2016.
White, "Development of an Unmanned Aerial Vehicle for the Measurement of Turbulence in the Atmospheric Boundary Layer", Atmosphere, v.8, issue 10, 195, pp. 1-25.
International Search Report and Written Opinion for PCT/US2023/023933 dated Sep. 26, 2023.
IEEE Conference Paper, "Research of the high pressure jet performance of small size nozzle," ISBN :978-1-5090-1087-5, Publication Date : Oct. 1, 2016, Conference dates Oct. 10, 2016 thru Oct. 12, 2016.[retrieved from the Internet] on Sep. 1, 2023 at 4:14pm.
International Search Report and Written Opinion for PCT/US22/38951, dated Nov. 28, 2022.
Kelly J F et al. "A capillary absorption spectrometer for stable carbon isotope ratio (C/C) analysis in very small samples", Review of Scientific Instruments, American Institute of Physics, 2 Huntington Quadrangle, Melville, NY 11747, vol. 83, No. 2, Feb. 1, 2012 (Feb.1, 2012), pp. 23101-23101, XP012161835, ISSN: 0034-6748, DOI: 10.1063/1.3680593.
Krings et al., Atmos. Meas. Tech., 11, 721-739, Feb. 7, 2018.
Clilverd, Mark A. et al., Energetic particle injection, acceleration, and loss during the geomagnetic disturbances which upset Galaxy 15, Journal of Geophysical Research, vol. 117, A12213, doi: 10.1029/2012JA018175, 2012, pp. 1-16 (Year:2012).
Kem, Christoph et al., Spatial Distribution of Halogen Oxides in the Plume of Mount Pagan Volcano, Mariana Islands, Geophysical Research Letters 10.1029/2018GL079245, Sep. 27, 2018, pp. 9588-9596 (Year:2018).
Liao, J. et al. Observations of Inorganic bromine(HOBr, BrO, and $Br_2$) speciation at Barrow, Alaska in spring 2009, Journal of Geophysical Research, vol. 117, D00R16, doi:10.1029/2011JD016641, 2012, pp. 1-11 (Year:2012).
Liu, Siwen et al., Development of a UAV-Based System to Monitor Air Quality over an Oil Field, Montana Technological University, Montana tech Library Digital Commons @ Montana Tech Graduate Theses & Non-Theses, Fall 2018, pp. 1-85 (Year:2018).
Miyama, Toru et al., Estimating allowable carbon emission for $CO_2$ concentration stabilization using a GCM-based Earth system model, Geophysical Research Letters, vol. 36,L19709, doi:10.1029/2009GL039678, 2009, pp. 0094-8276 (Year:2009).
Oppenheimer Clive et al., Ultraviolet Sensing of Volcanic Sulfur Emissions, Elements (An Internatioknal Magazine of Mineralogy, Geochemistry, and Petrology), Apr. 2010, vol. 6, pp. 87-92 (Year: 2010).
Parazoo, Nicholas C. et al., Interpreting seasonal changes in the carbon balance of southern Amazonia using measurements of $XCO_2$ and chlorophyll fluorescence from GOSAT, Geophysical Research Letters, vol. 40.2829-2833, doi: 10.1002/grl.50452, 2013 p. (s0 2829-2833 (Year:2013).
Queiber, Manuel et al., A new frontier in $CO_2$ flux measurements using a highly portable DIAL laser system, Scientific Reports, DOI: 10.1038/srep33834 1, Sep. 22, 2016, pp. 1-13(Year:2016).
Queiber, Manuel et al., Large-area quantification of subaerial $CO_2$ anomalies with portable laser remote sensing and 2d tomography, The Leading Edge Mar. 2018, pp. 306-313 (Year:2018).
International Search Report and Written Opinion for PCT/US23/23905 dated Oct. 5, 2023.
Lilian Joly, The evolution of AMULSE (Atmospheric Measurements by Ultra-Light Spectrometer) and its interest in atmospheric applications. Results of the Atmospheric Profiles of Greenhouse

(56) References Cited

OTHER PUBLICATIONS gasEs (APOGEE) weather balloon release campaign for satellite retrieval validation, p. 1-28, Sep. 25, 2019, Atmospheric Measurement Techniques Discussion (Joly).

International Search Report and Written Opinion for PCT/US23/13893, dated Jun. 30, 2023.

Development of a mobile tracer correlation method for assessment of air emissions from landfills and other area sources, Atmospheric Environment 102 (2015) 323-330. T.A. Foster-Wittig et. al. 2015.

Measurements of Methane Emissions from Landfills Using a Time Correlation Tracer Method Based on FTIR Absorption Spectroscopy, Environ. Sci. Technol. 2001, 35, 21-25, B. Galle et al. 2001.

Feng, Lingbing, Nowak, Gen, O'Neill, T.J., Welsh, A.H."Cutoff; A spatio-temporal imputation method." Journal of Hydrology 519 (2014) : 3591-3605 (Year:2014).

Cabreira et al. "Survey on Coverage Path Planning with Unmanned Aerial Vehicles", published: Drones, published: Jan. 2019, pp. 1-38, year 2019.

\* cited by examiner

LOGARITHMIC DEMODULATOR FOR LASER WAVELENGTH-MODULATON SPECTROSCOPY

CROSS-REFERENCE TO RELATED APPLICATION

This application is a 35 U.S.C. § 371 National Stage Entry of International Application No. PCT/US21/24177, filed Mar. 25, 2021, which claims the priority benefit of U.S. Provisional Patent Application Ser. No. 62/994,680 filed Mar. 25, 2020, all of which are incorporated herein by reference in their entirety for all purposes.

FIELD OF ENDEAVOR

The invention relates generally to Wavelength Modulation Spectroscopy (WMS), and more particularly to demodulation of WMS signals.

BACKGROUND

Modulation techniques may be based on a decrease in technical noise with a corresponding increase in frequency (often referred to as a 1/f noise). Signal contrast may be improved by encoding and detecting the absorption signal at a high frequency where the noise level may be low. One such modulation technique is wavelength modulation spectroscopy (WMS). WMS rapidly scans the frequency of the light across the absorbing transition. The demodulated signal in WMS may be low in the absence of absorbers and limited by residual amplitude modulation. Tunable diode laser absorption spectroscopy (TDLAS) may utilize WMS to measure the concentration of certain species of gasses using tunable diode lasers and laser absorption spectrometry. The typical sensitivity of WMS may be in the $10^{-5}$ range.

SUMMARY

A system embodiment may include: a first band-pass filter, where the first band-pass filter may be configured to receive and filter a detector signal; a second band-pass filter, where the second band-pass filter may be configured to receive and filter the detector signal; a first logarithmic amplifier (Log Amp), where the first Log Amp may be configured to apply a first filtered detector signal from the first band-pass filter; a second Log Amp, where the second Log Amp may be configured to apply a second filtered detector signal from the second band-pass filter; a differential amplifier, where the differential amplifier may be configured to subtract a first applied signal from the first Log Amp from a second applied signal from the second Log Amp; and an Anti-Log Amplifier, where the Anti-Log Amplifier may be configured to determine an inverse logarithm of a subtracted signal from the differential amplifier.

In additional system embodiments, the first band-pass filter has a central frequency of 2f. In additional system embodiments, the second band-pass filter has a central frequency of 1f. In additional system embodiments, the first band-pass filter has a central frequency of one of an integer order harmonic frequency greater than two.

Additional system embodiments may include a single power supply. In additional system embodiments, the single power supply does not comprise differential supply voltages. Additional system embodiments may include a first low-pass filter, where the first low-pass filter applies a low-pass filter to the first applied signal from the first Log Amp.

Additional system embodiments may include a second low-pass filter, where the second low-pass filter applies a low-pass filter to the second applied signal from the second Log Amp.

In additional system embodiments, the determined inverse logarithm may be not influenced by a phase of the detector signal.

A method embodiment may include: filtering a detector signal at a first band-pass filter; filtering the detector signal at a second band-pass filter; applying a first filtered detector signal from the first band-pass filter to a first logarithmic amplifier (Log Amp); applying a second filtered detector signal from second first band-pass filter to a second Log Amp; subtracting the first applied signal from the first Log Amp from the second applied signal from the second Log Amp by a differential amplifier; and determining an inverse logarithm of the subtracted signal from the differential amplifier by an Anti-Log Amplifier.

In additional method embodiments, the first band-pass filter has a central frequency of 2f. In additional method embodiments, the second band-pass filter has a central frequency of 1f. In additional method embodiments, the first band-pass filter has a central frequency of one of: 3f and 4f.

Additional method embodiments may include: powering, via a single power supply, a circuit comprising the first band-pass filter, the second band-pass filter, the first Log Amp, the second Log Amp, the differential amplifier, and the Anti-Log Amplifier. In additional method embodiments, the single power supply does not comprise differential supply voltages.

Additional method embodiments may include: applying a low-pass filter to the first applied signal from the first Log Amp. Additional method embodiments may include: applying a low-pass filter to the second applied signal from the second Log Amp. In additional method embodiments, the determined inverse logarithm may be not influenced by a phase of the detector signal.

Another system embodiment may include: a first band-pass filter, where the first band-pass filter may be configured to receive and filter a detector signal, and where the first band-pass filter has a central frequency of 2f; a second band-pass filter, where the second band-pass filter may be configured to receive and filter the detector signal, and where the second band-pass filter has a central frequency of 1f; a first logarithmic amplifier (Log Amp), where the first Log Amp may be configured to apply the filtered detector signal from the first band-pass filter; a second Log Amp, where the second Log Amp may be configured to apply the filtered detector signal from the second band-pass filter; a differential amplifier, where the differential amplifier may be configured to subtract the applied signal from the first Log Amp from the applied signal from the second Log Amp; and an Anti-Log Amplifier, where the Anti-Log Amplifier may be configured to determine an inverse logarithm of the subtracted signal from the differential amplifier.

Additional system embodiments may include: a first low-pass filter applied to the first applied signal from the first Log Amp; and a second low-pass filter applied to the second applied signal from the second Log Amp.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which.

DETAILED DESCRIPTION

Figure 1:
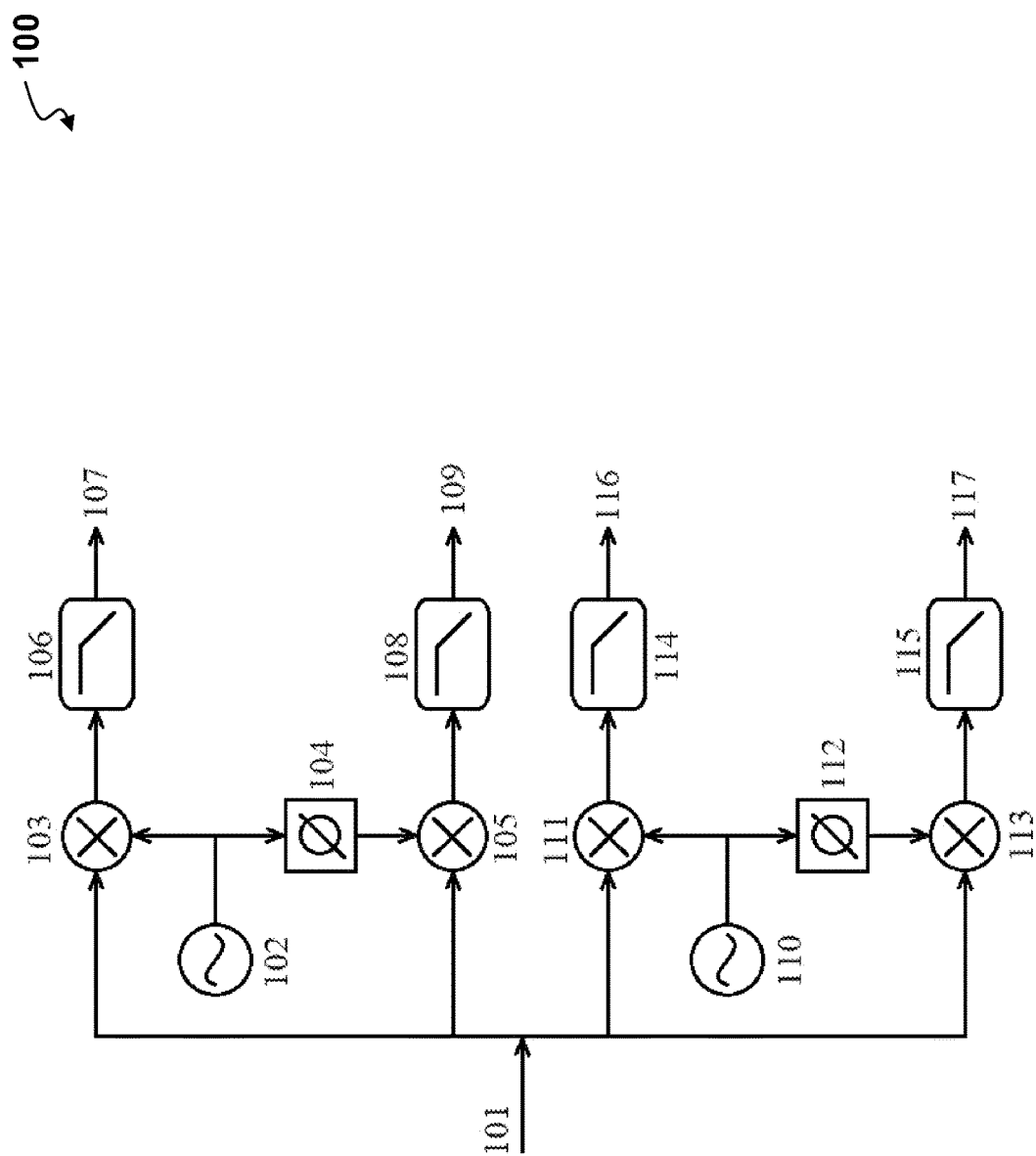
FIG. 1 depicts a functional block diagram of a system that extracts a real-component and an imaginary-component of 1f and 2f signals from a detector output, according to one embodiment.

The following description is made for the purpose of illustrating the general principles of the embodiments discloses herein and is not meant to limit the concepts disclosed herein. Further, particular features described herein can be used in combination with other described features in each of the various possible combinations and permutations. Unless otherwise specifically defined herein, all terms are to be given their broadest possible interpretation, including meanings implied from the description as well as meanings understood by those skilled in the art and/or as defined in dictionaries, treatises, etc.

Two techniques can be employed for Tunable Diode Laser Absorption Spectroscopy (TDLAS). The Direct Absorption Spectroscopy (DAS) is based on the measurement of the absorption graph while scanning the laser wavelength. The Wavelength Modulation Spectroscopy (WMS) is based on the measurement of gas absorption harmonics while scanning the laser wavelength and simultaneously modulating it (at 1f frequency). Even though in the examples disclosed herein the first frequency harmonic (1f) and second frequency harmonic (2f) are described, other embodiments of the invention are equally applicable to any harmonic nf, where f is a frequency harmonic such as 1f, 2f, 3f, 4f, and the like. While the disclosed systems and methods use WMS, these principles may also be applied to systems and methods for TDLAS.

The sensitivity of laser spectroscopy systems is increased by employing the modulation techniques compared to direct absorption (DA) methods. Modulation allows for precise filtering of the undesired noises due to shifting the measurement into a known frequency, resulting in a larger signal-to-noise ratio for WMS compared to the DAS technique. In WMS, the second harmonic signal, 2f, is often employed to extract the gas concentration. To compensate for the laser intensity dependency, the 2f signal is normalized by DA or 1f.

For demodulation of the WMS signal on the output of the optical detector, lock-in amplifiers can be employed to extract the amplitude of the modulated signal. In its simplest form, the modulated signal is mixed (multiplied) into the modulation clock signal. The output of the mixer, after low-pass filtering, returns the 2f scan pattern. A lock-in amplifier with a single built-in analog multiplier is phase-dependent. To make the process independent from the effect of phase, the detector signal can be multiplied into both Sine and Cosine components of the modulation oscillator at the same time (or multiplied into the modulation oscillator signal and its 90-degree phase shifted signal). This process requires two analog multipliers. With the same logic, to extract the 1f data, 2 more analog multipliers are required.

According to an embodiment of a logarithmic-based demodulator for Laser Wavelength-Modulation Spectroscopy disclosed herein, a demodulator for laser WMS employs a phase-independent WMS technique with 2f/1f signal recovery. In one example implementation, said logarithmic demodulator comprises two band-pass filters, one allows the 2f signal to pass through, and the second one allows the 1f signal to pass through. In a logarithmic-based demodulator system, according to an embodiment of the invention, the signals on the output of the two band-pass filters are then applied into separate logarithmic amplifiers (Log Amps) and differentiated employing a differential amplifier. The inverse logarithm of the differential signal, presented on the output of the anti-log amplifier, returns the 2f/1f signal. The logarithmic-based demodulator system is intrinsically phase independent. Phase adjustment or extra calculations are not required for phase compensation in a preferred embodiment.

Compared to lock-in amplifiers, in one embodiment, the logarithmic-based demodulator system requires a single power supply, requires a reduced number of components, is more compact, and is cost-effective. In one embodiment, the logarithmic-based demodulator system results in a higher dynamic range as compared to analog multiplier-based circuits.

There may be several ways to build different elements (103, 104, 114, 119, 126, 128, 130, 131, 133) of the lock-in demodulator or Log-demodulator system. In one embodiment, active or passive electronic components may be employed to build these elements. In the case of using active electronic components to build any of these elements, a power source is needed to energize the active electronic parts. In the case of lock-in demodulator, some elements such as multiplier elements require a differential power source. The differential power source may be a 3-wire source including 1 negative voltage, 1 positive voltage, and 1 ground wire.

Accordingly, a logarithmic-based demodulator system embodiment may include: a first band-pass filter, where the first band-pass filter is configured to receive and filter a detector signal, and wherein the first band-pass filter has a central frequency of 2f; a second band-pass filter, where the second band-pass filter is configured to receive and filter the detector signal, and wherein the second band-pass filter has a central frequency of 1f; a first logarithmic amplifier (Log Amp), wherein the first Log Amp is configured to apply the filtered detector signal from the first band-pass filter; a second Log Amp, wherein the second Log Amp is configured to apply the filtered detector signal from the second band-pass filter; a differential amplifier, where the differential amplifier is configured to subtract the applied signal from the first Log Amp from the applied signal from the second Log Amp; and an Anti-Log Amplifier, where the Anti-Log Amplifier is configured to determine an inverse logarithm of the subtracted signal from the differential amplifier.

A logarithmic-based demodulation process embodiment may include: filtering a detector signal at a first band-pass filter, where the first band-pass filter has a central frequency of 2f; filtering the detector signal at a second band-pass filter, where the second band-pass filter has a central frequency of 1f; applying the filtered detector signal from the first band-pass filter to a first logarithmic amplifier (Log Amp); applying the filtered detector signal from the second first band-pass filter to a second Log Amp; subtracting the applied signal from the first Log Amp from the applied signal from the second Log Amp by a differential amplifier; and determining an inverse logarithm of the subtracted signal from the differential amplifier by an Anti-Log Amplifier.

Additional method embodiments may include: applying a low-pass filter to the applied signal from the first Log Amp and the applied signal from the second Log Amp.

Referring to the system in FIG. 1, the depicted circuit 100 extracts the 2f/1f signal from the optical detector signal 101, requiring four 4-quadrant analog multipliers. The optical detector signal 101 is mixed with a first oscillator 102, which generates a cosine-wave signal with 2f frequency. A first mixer 103 is a 4-quadrant analog multiplier. A mixer output after a first low-pass filter 106 results in a real-component 107 of the 2f scan signal. The cut-off frequency of the first low-pass filter 106 is designed to block the 4f frequency and any frequencies above the 4f frequency.

The oscillator signal from the first oscillator 102 is 90-degree phase-shifted using a first phase shifter 104. The signal is then multiplied into the detector signal 101 using a first 4-quadrant analog multiplier 105. The mixer output after a second low-pass filter 108 results in an imaginary-component 109 of the 2f signal. The cut-off frequency of the second low-pass filter 108 is designed to block the 4f frequency and any frequencies above the 4f frequency.

The optical detector signal 101 is mixed with a second oscillator 110, which generates a cosine-wave signal with 1f frequency. A second mixer 111 is a 4-quadrant analog multiplier. The mixer output, after a third low-pass filter 114 results in the real-component 116 of the 1f scan signal. The cut-off frequency of the third low-pass filter 114 is designed to block the 2f frequency and any frequencies above that.

The oscillator signal of the second oscillator 110 is 90-degree phase-shifted using a second phase shifter 112. The signal is then multiplied into the detector signal 101 using a second 4-quadrant analog multiplier 113. The mixer output after a fourth low-pass filter 115 results in the imaginary-component 117 of the 1f signal. The cut-off frequency of the fourth low-pass filter 115 is designed to block the 4f frequency and any frequencies above the 4f frequency.

Figure 2:
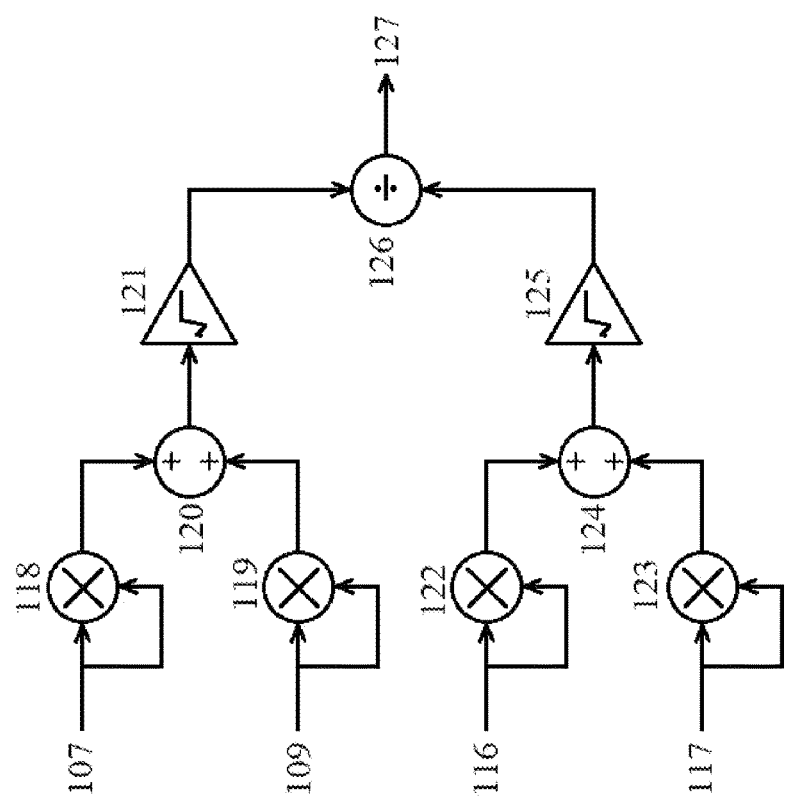
FIG. 2 depicts a functional block diagram of a system that extracts the 2f/1f signal from a real-component and an imaginary-component of 1f and 2f signals, according to one embodiment.

Referring to the system in FIG. 2, the depicted circuit 200 calculates and divides the amplitude of the 2f signal and the 1f signal to achieve a desired 2f/1f scan signal. To calculate the amplitude of the 2f signal, the real-component of the 2f signal 107 is squared using a third multiplier 118. The imaginary-component of the 2f signal 109 is also squared using a fourth multiplier 119.

The squared signals after summation by 120 are passed through a first square root calculator 121 to result in an amplitude of the 2f signal. To calculate the amplitude of the 1f signal, the real-component of the 1f signal 116 is squared using a fifth multiplier 122. The imaginary-component of the 1f signal 117 is also squared using a sixth multiplier 123. The squared signals after summation by 124 are passed through a second square root calculator 125 to result in the amplitude of the 1f signal. The amplitude signals are finally divided by a divider 126 to result in the 2f/1f signal 127.

The depicted circuit 200 may require a differential power supply to operate. In some embodiments, additional filtering, biasing, and decoupling components may need to be added to the depicted circuit 200. In some embodiments, the depicted circuit 200 may have a large power consumption and required board size due to the required components. In addition, the dynamic range of the depicted circuit 200 may be affected by the performance of the analog multipliers.

Figure 3A:
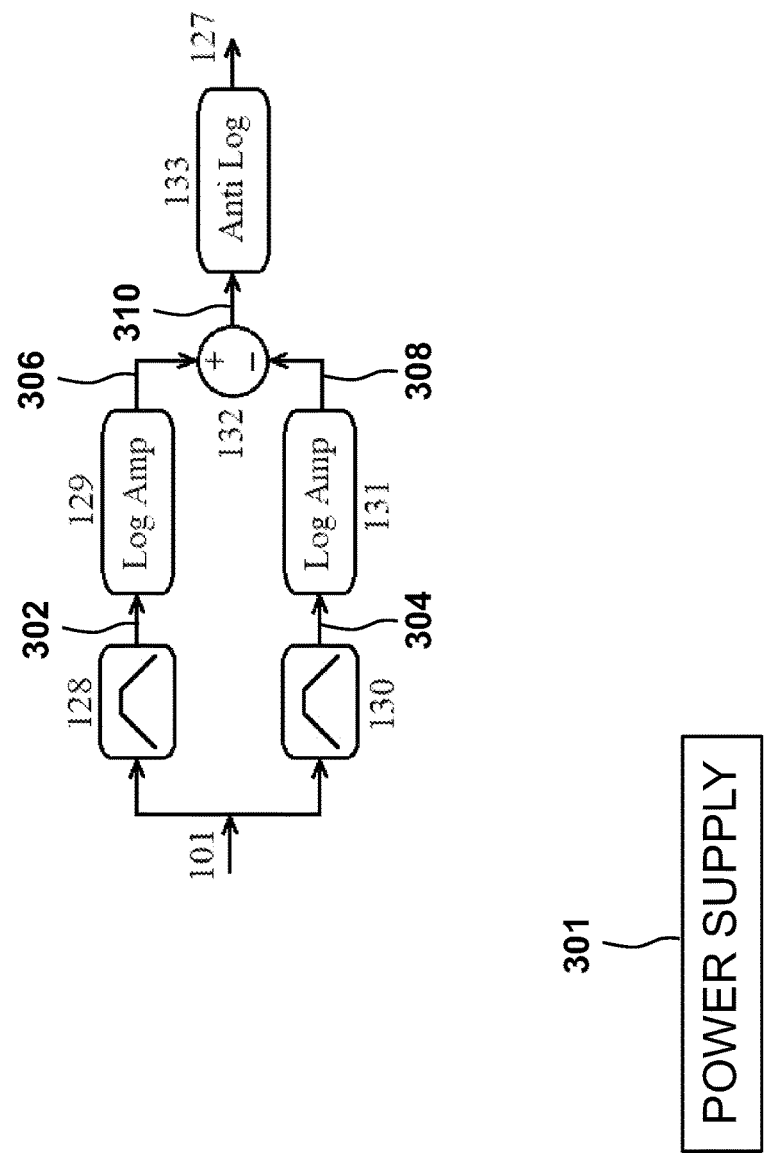
FIG. 3A depicts a functional block diagram of a system that implements an embodiment of the logarithmic demodulator for laser wavelength-modulation spectroscopy, according to one embodiment.

Referring to the system in FIG. 3A, the depicted circuit 300 is an example system implementing an embodiment of the logarithmic demodulator for laser wavelength-modulation spectroscopy, disclosed herein. The circuit 300 allows for a phase-independent WMS technique with 2f/1f signal recovery. In one example implementation, a detector signal 101 is passed through two band-pass filters 128, 130. The first band-pass filter 128 has the central frequency of 2f and the second band-pass filter 130 has the central frequency of 1f. The band-pass filtered signals 302, 304 are then applied to a first Log Amp 129 and a second Log Amp 131. The first band-pass filtered signal 302 is applied to a first Log Amp 129 and the second band-pass filtered signal 304 is applied to the second Log Amp 131.

The output signals 306, 308 of the Log Amps 129, 131 present the logarithm of the input signal's envelope. The output signals 306, 308 of the first Log Amp 129 and the second Log Amp 131, after an optional low-pass filtering, are subtracted using a differential amplifier 132. The optional low-pass filter may reduce the noise on the output of the Log-Demod, improving the precision of the entire system. The 2f/1f signal 127 is achieved by calculating an inverse logarithm of the differential signal 310, presented on the output of the anti-log amplifier 133. In some embodiments, the anti-log amplifier 133 may be replaced with a processor in order to process the 2f/1f signal 127 digitally instead of analog.

The performance and functionality of Log Amps are not influenced by the phase of the input signal. Hence, the depicted circuit 300 is phase independent. In one embodiment, the components of the depicted circuit 300 can be implemented on a single power supply 301 without a need for differential supply voltages. For a Log-demodulator system, the electronic components that do not require differential power source may be employed. These components may be powered using the single power supply 301. This single power supply 301 may be a 2-wire source including one positive voltage and one ground wire. The power supply 301 may be connected to one or multiple elements of the lock-in demodulator or Log-demodulator system. Differential power supplies are larger, heavier, more complex, and more costly compared to the single power supply 301. In most cases, differential power supplies are made of two single power supplies connected in series, which may require double the electronic parts needed.

This structure of the depicted circuit 300, as compared to lock-in amplifiers, may require a lower number of components, may be more compact, and may be more cost-effective. Furthermore, circuit 300 utilizing Log Amps results in a higher dynamic range as compared to an analog multiplier-based circuit.

Figure 3B:
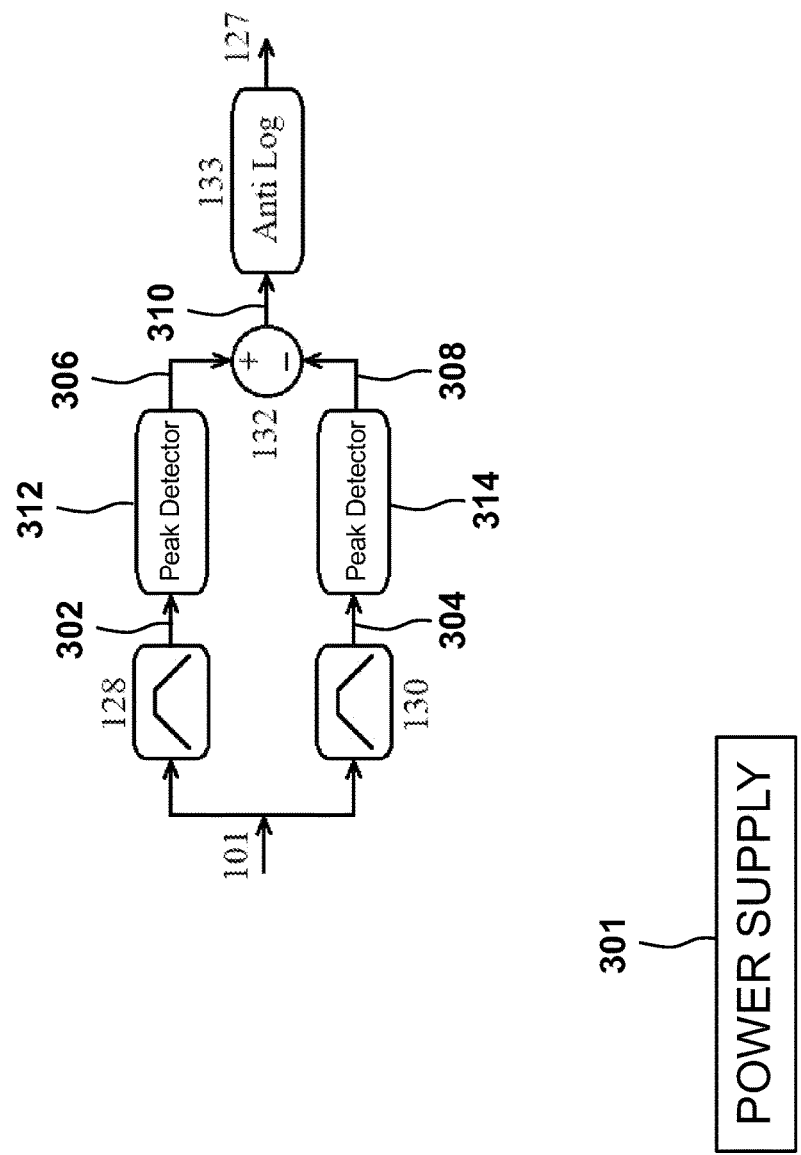
FIG. 3B depicts an alternate functional block diagram of a system that implements an embodiment of the logarithmic demodulator for laser wavelength-modulation spectroscopy, according to one embodiment.

In FIG. 3B, the depicted circuit 303 is an example alternate system implementing an embodiment of the logarithmic demodulator for laser wavelength-modulation spectroscopy, disclosed herein. The depicted circuit 303 in FIG. 3B is similar to the circuit 300 in FIG. 3A, except that the first Log Amp (129, FIG. 3A) is replaced with a first peak detector circuit 312 and the second Log Amp (131, FIG. 3A) is replaced with a second peak detector circuit 314. In some embodiments, the first peak detector circuit 312 and/or the second peak detector circuit 314 may be amplitude detector circuits or logarithm function converters.

Figure 4:
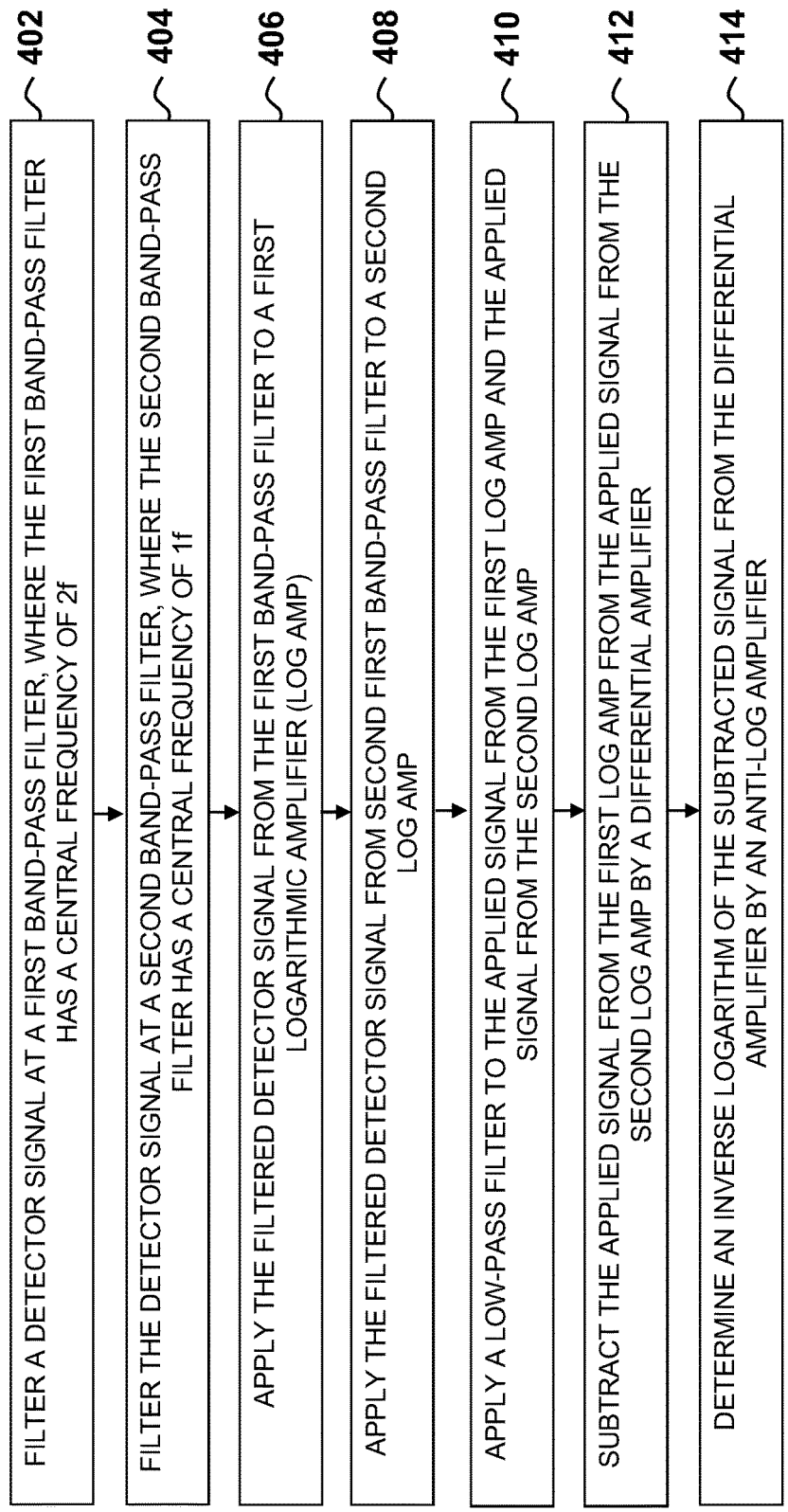
FIG. 4 depicts a high-level flowchart of a method embodiment of the logarithmic demodulator for laser wavelength-modulation spectroscopy, according to one embodiment.

Referring to FIG. 4, a high-level flowchart of a method 400 embodiment of the logarithmic demodulator for laser wavelength-modulation spectroscopy disclosed herein is depicted, according to one embodiment. The method 400 may include filtering a detector signal at a first band-pass filter, where the first band-pass filter has a central frequency of 2f (step 402). The method 400 may then include filtering the detector signal at a second band-pass filter, where the second band-pass filter has a central frequency of 1f (step 404).

The method 400 may then include applying the filtered detector signal from the first band-pass filter to a first logarithmic amplifier (Log Amp) (step 406). The method 400 may then include applying the filtered detector signal from the second first band-pass filter to a second Log Amp (step 408). In some embodiments, the method 400 may then include optionally applying a low-pass filter to the applied signal from the first Log Amp and the applied signal from the second Log Amp (step 410).

The method 400 may then include subtracting the applied signal from the first Log Amp from the applied signal from the second Log Amp by a differential amplifier (step 412). The method 400 may then include determining an inverse logarithm of the subtracted signal from the differential amplifier by an Anti-Log Amplifier (step 414). In some embodiments, the first Log Amp and the second Log Amp may be replaced with peak or amplitude detector circuits and logarithm function converters.

Figure 5:
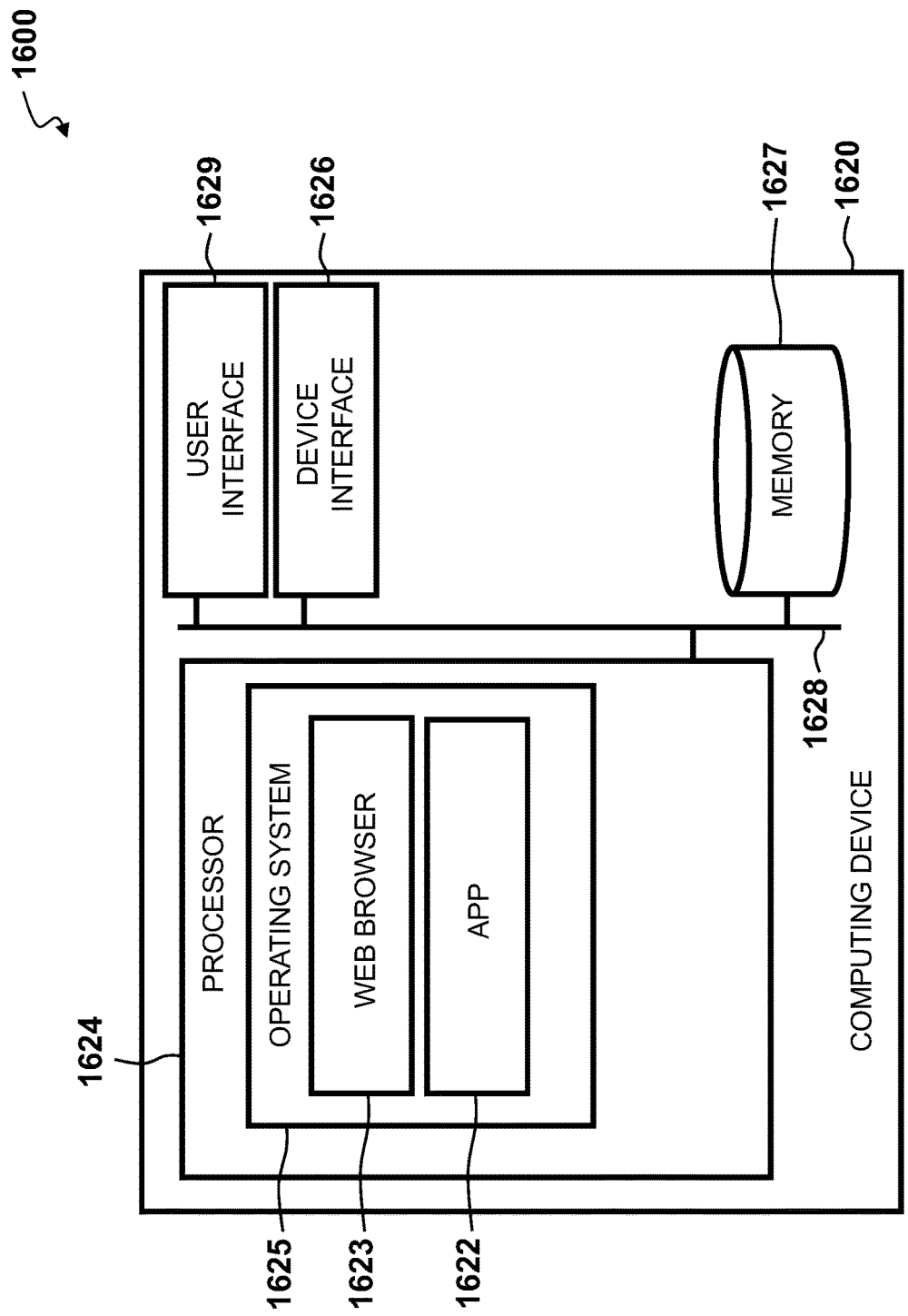
FIG. 5 illustrates an example top-level functional block diagram of a computing device embodiment, according to one embodiment.

FIG. 5 illustrates an example of a top-level functional block diagram of a computing device embodiment 1600. The example operating environment is shown as a computing device 1620 comprising a processor 1624, such as a central processing unit (CPU), addressable memory 1627, an external device interface 1626, e.g., an optional universal serial bus port and related processing, and/or an Ethernet port and related processing, and an optional user interface 1629, e.g., an array of status lights and one or more toggle switches, and/or a display, and/or a keyboard and/or a pointer-mouse system and/or a touch screen. Optionally, the addressable memory may, for example, be: flash memory, eprom, and/or a disk drive or other hard drive. These elements may be in communication with one another via a data bus 1628. In some embodiments, via an operating system 1625 such as one supporting a web browser 1623 and applications 1622, the processor 1624 may be configured to execute steps of a process establishing a communication channel and processing according to the embodiments described above.

System embodiments include computing devices such as a server computing device, a buyer computing device, and a seller computing device, each comprising a processor and addressable memory and in electronic communication with each other. The embodiments provide a server computing device that may be configured to: register one or more buyer computing devices and associate each buyer computing device with a buyer profile; register one or more seller computing devices and associate each seller computing device with a seller profile; determine search results of one or more registered buyer computing devices matching one or more buyer criteria via a seller search component. The service computing device may then transmit a message from the registered seller computing device to a registered buyer computing device from the determined search results and provide access to the registered buyer computing device of a property from the one or more properties of the registered seller via a remote access component based on the transmitted message and the associated buyer computing device; and track movement of the registered buyer computing device in the accessed property via a viewer tracking component. Accordingly, the system may facilitate the tracking of buyers by the system and sellers once they are on the property and aid in the seller's search for finding buyers for their property. The figures described below provide more details about the implementation of the devices and how they may interact with each other using the disclosed technology.

Figure 6:
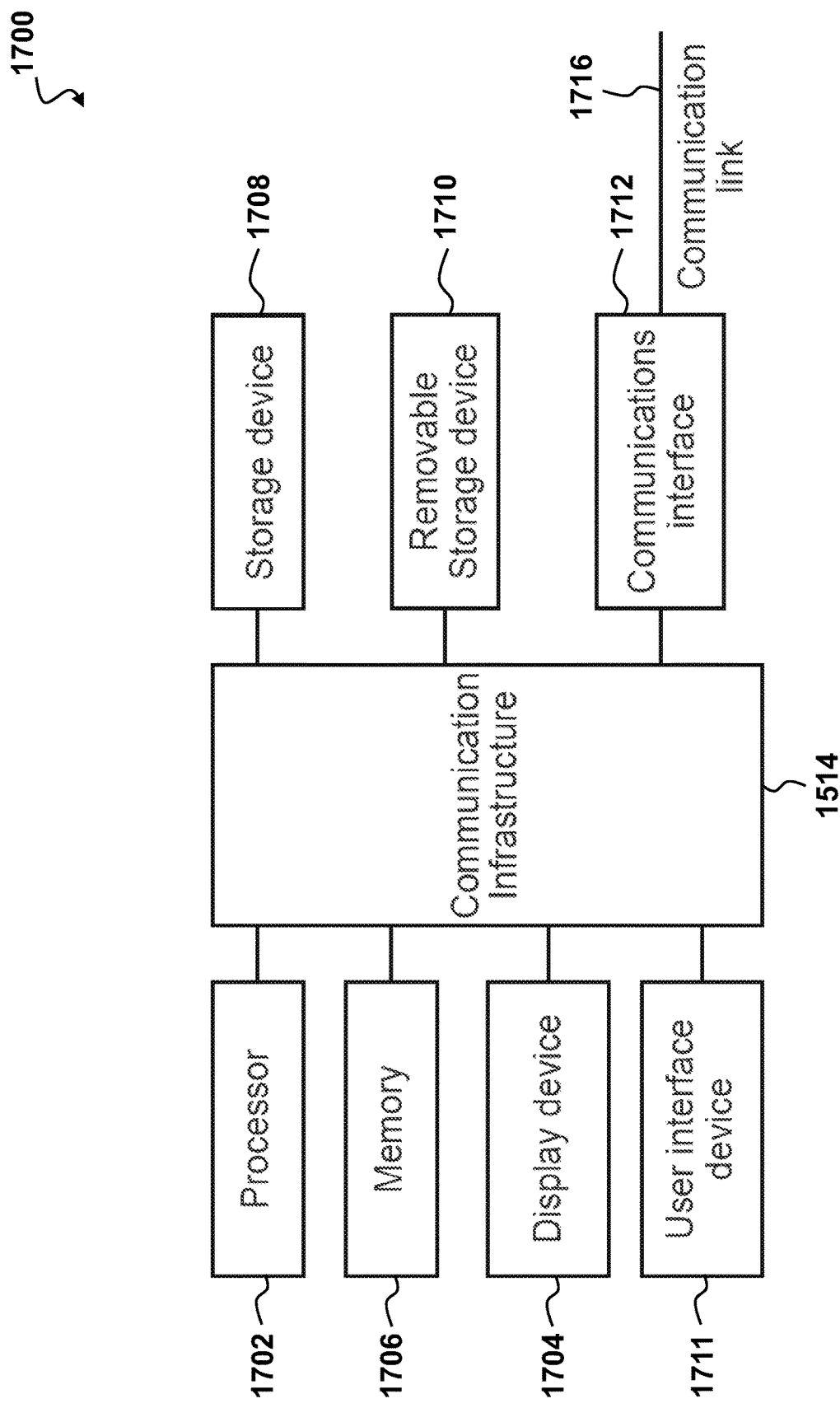
FIG. 6 shows a high-level block diagram and process of a computing system for implementing an embodiment of the system and process, according to one embodiment.

FIG. 6 is a high-level block diagram 1700 showing a computing system comprising a computer system useful for implementing an embodiment of the system and process, disclosed herein. Embodiments of the system may be implemented in different computing environments. The computer system includes one or more processors 1702, and can further include an electronic display device 1704 (e.g., for displaying graphics, text, and other data), a main memory 1706 (e.g., random access memory (RAM)), storage device 1708, a removable storage device 1710 (e.g., removable storage drive, a removable memory module, a magnetic tape drive, an optical disk drive, a computer readable medium having stored therein computer software and/or data), user interface device 1711 (e.g., keyboard, touch screen, keypad, pointing device), and a communication interface 1712 (e.g., modem, a network interface (such as an Ethernet card), a communications port, or a PCMCIA slot and card). The communication interface 1712 allows software and data to be transferred between the computer system and external devices. The system further includes a communications infrastructure 1514 (e.g., a communications bus, cross-over bar, or network) to which the aforementioned devices/modules are connected as shown.

Information transferred via communications interface 1712 may be in the form of signals such as electronic, electromagnetic, optical, or other signals capable of being received by communications interface 1712, via a communication link 1716 that carries signals and may be implemented using wire or cable, fiber optics, a phone line, a cellular/mobile phone link, an radio frequency (RF) link, and/or other communication channels. Computer program instructions representing the block diagram and/or flowcharts herein may be loaded onto a computer, programmable data processing apparatus, or processing devices to cause a series of operations performed thereon to produce a computer implemented process.

Embodiments have been described with reference to flowchart illustrations and/or block diagrams of methods, apparatus (systems) and computer program products according to embodiments. Each block of such illustrations/diagrams, or combinations thereof, can be implemented by computer program instructions. The computer program instructions when provided to a processor produce a machine, such that the instructions, which execute via the processor, create means for implementing the functions/operations specified in the flowchart and/or block diagram. Each block in the flowchart/block diagrams may represent a hardware and/or software module or logic, implementing embodiments. In alternative implementations, the functions noted in the blocks may occur out of the order noted in the figures, concurrently, etc.

Computer programs (i.e., computer control logic) are stored in main memory and/or secondary memory. Computer programs may also be received via a communications interface 1712. Such computer programs, when executed, enable the computer system to perform the features of the embodiments as discussed herein. In particular, the computer programs, when executed, enable the processor and/or multi-core processor to perform the features of the computer system. Such computer programs represent controllers of the computer system.

Figure 7:
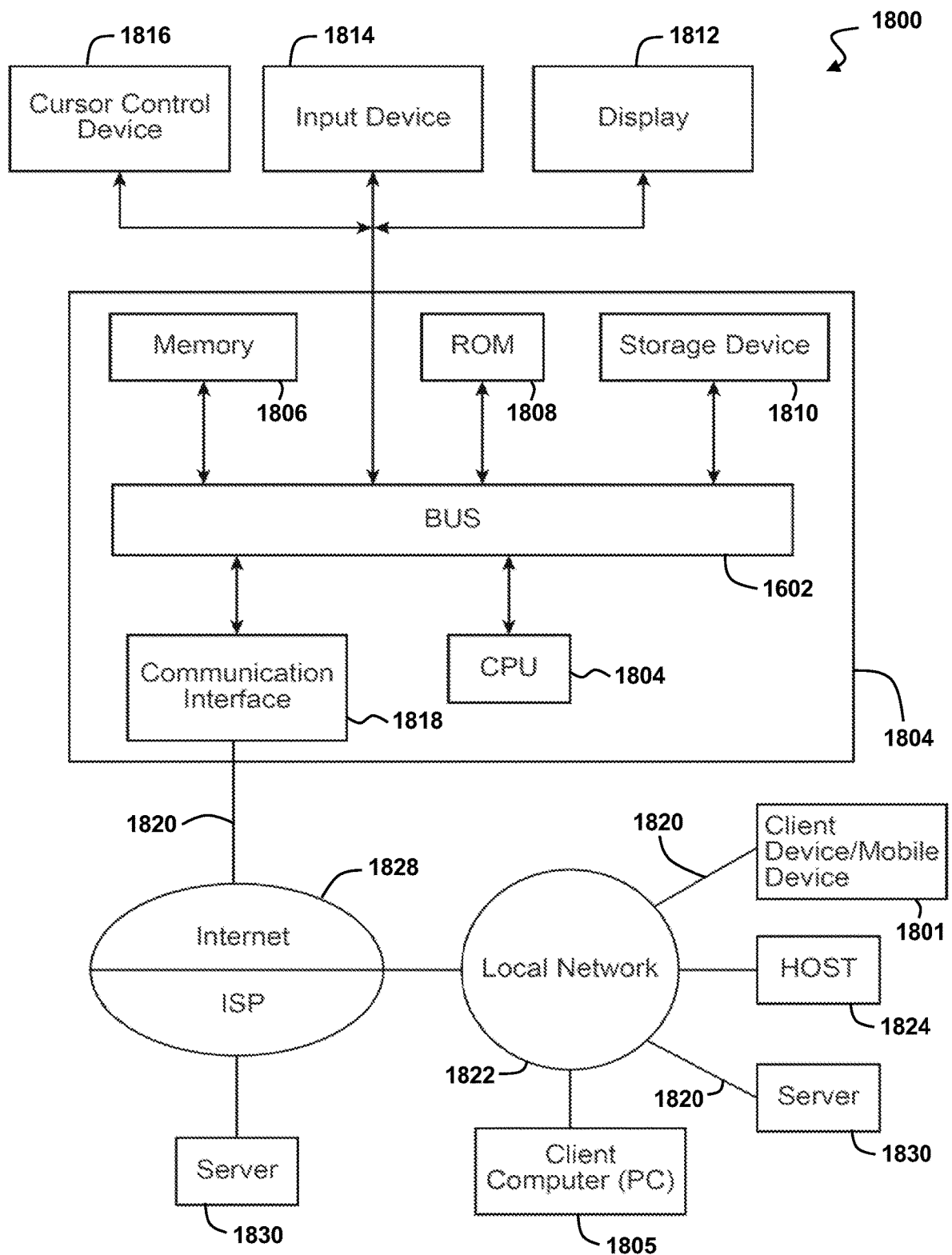
FIG. 7 shows a block diagram and process of an exemplary system in which an embodiment may be implemented, according to one embodiment.

FIG. 7 shows a block diagram of an example system 1800 in which an embodiment may be implemented. The system 1800 includes one or more client devices 1801 such as consumer electronics devices, connected to one or more server computing systems 1830. A server 1830 includes a bus 1802 or other communication mechanism for communicating information, and a processor (CPU) 1804 coupled with the bus 1802 for processing information. The server 1830 also includes a main memory 1806, such as a random access memory (RAM) or other dynamic storage device, coupled to the bus 1802 for storing information and instructions to be executed by the processor 1804. The main memory 1806 also may be used for storing temporary variables or other intermediate information during execution or instructions to be executed by the processor 1804. The server computer system 1830 further includes a read only memory (ROM) 1808 or other static storage device coupled to the bus 1802 for storing static information and instructions for the processor 1804. A storage device 1810, such as a magnetic disk or optical disk, is provided and coupled to the bus 1802 for storing information and instructions. The bus 1802 may contain, for example, thirty-two address lines for addressing video memory or main memory 1806. The bus 1802 can also include, for example, a 32-bit data bus for transferring data between and among the components, such as the CPU 1804, the main memory 1806, video memory and the storage 1810. Alternatively, multiplex data/address lines may be used instead of separate data and address lines.

The server 1830 may be coupled via the bus 1802 to a display 1812 for displaying information to a computer user. An input device 1814, including alphanumeric and other keys, is coupled to the bus 1802 for communicating information and command selections to the processor 1804. Another type or user input device comprises cursor control 1816, such as a mouse, a trackball, or cursor direction keys for communicating direction information and command selections to the processor 1804 and for controlling cursor movement on the display 1812.

According to one embodiment, the functions are performed by the processor 1804 executing one or more sequences of one or more instructions contained in the main memory 1806. Such instructions may be read into the main memory 1806 from another computer-readable medium, such as the storage device 1810. Execution of the sequences of instructions contained in the main memory 1806 causes the processor 1804 to perform the process steps described herein. One or more processors in a multi-processing arrangement may also be employed to execute the sequences of instructions contained in the main memory 1806. In alternative embodiments, hard-wired circuitry may be used in place of or in combination with software instructions to implement the embodiments. Thus, embodiments are not limited to any specific combination of hardware circuitry and software.

The terms "computer program medium," "computer usable medium," "computer readable medium", and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network that allow a computer to read such computer readable information. Computer programs (also called computer control logic) are stored in main memory and/or secondary memory. Computer programs may also be received via a communications interface. Such computer programs, when executed, enable the computer system to perform the features of the embodiments as discussed herein. In particular, the computer programs, when executed, enable the processor multi-core processor to perform the features of the computer system. Accordingly, such computer programs represent controllers of the computer system.

Generally, the term "computer-readable medium" as used herein refers to any medium that participated in providing instructions to the processor 1804 for execution. Such a medium may take many forms, including but not limited to, non-volatile media, volatile media, and transmission media. Non-volatile media includes, for example, optical or magnetic disks, such as the storage device 1810. Volatile media includes dynamic memory, such as the main memory 1806. Transmission media includes coaxial cables, copper wire and fiber optics, including the wires that comprise the bus 1802. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, an EPROM, a FLASH-EPROM, any other memory chip or cartridge, a carrier wave as described hereinafter, or any other medium from which a computer can read.

Various forms of computer readable media may be involved in carrying one or more sequences of one or more instructions to the processor 1804 for execution. For example, the instructions may initially be carried on a magnetic disk of a remote computer. The remote computer can load the instructions into its dynamic memory and send the instructions over a telephone line using a modem. A modem local to the server 1830 can receive the data on the telephone line and use an infrared transmitter to convert the data to an infrared signal. An infrared detector coupled to the bus 1802 can receive the data carried in the infrared signal and place the data on the bus 1802. The bus 1802 carries the data to the main memory 1806, from which the processor 1804 retrieves and executes the instructions. The instructions received from the main memory 1806 may optionally be stored on the storage device 1810 either before or after execution by the processor 1804.

The server 1830 also includes a communication interface 1818 coupled to the bus 1802. The communication interface 1818 provides a two-way data communication coupling to a network link 1820 that is connected to the world wide packet data communication network now commonly referred to as the Internet 1828. The Internet 1828 uses electrical, electromagnetic or optical signals that carry digital data streams. The signals through the various networks and the signals on the network link 1820 and through the communication interface 1818, which carry the digital data to and from the server 1830, are exemplary forms or carrier waves transporting the information.

In another embodiment of the server 1830, interface 1818 is connected to a network 1822 via a communication link 1820. For example, the communication interface 1818 may be an integrated services digital network (ISDN) card or a modem to provide a data communication connection to a corresponding type of telephone line, which can comprise part of the network link 1820. As another example, the communication interface 1818 may be a local area network (LAN) card to provide a data communication connection to a compatible LAN. Wireless links may also be implemented. In any such implementation, the communication interface 1818 sends and receives electrical electromagnetic or optical signals that carry digital data streams representing various types of information.

The network link 1820 typically provides data communication through one or more networks to other data devices. For example, the network link 1820 may provide a connection through the local network 1822 to a host computer 1824 or to data equipment operated by an Internet Service Provider (ISP). The ISP in turn provides data communication services through the Internet 1828. The local network 1822 and the Internet 1828 both use electrical, electromagnetic or optical signals that carry digital data streams. The signals through the various networks and the signals on the network link 1820 and through the communication interface 1818, which carry the digital data to and from the server 1830, are exemplary forms or carrier waves transporting the information.

The server 1830 can send/receive messages and data, including e-mail, program code, through the network, the network link 1820 and the communication interface 1818. Further, the communication interface 1818 can comprise a USB/Tuner and the network link 1820 may be an antenna or cable for connecting the server 1830 to a cable provider, satellite provider or other terrestrial transmission system for receiving messages, data and program code from another source.

The example versions of the embodiments described herein may be implemented as logical operations in a distributed processing system such as the system 1800 including the servers 1830. The logical operations of the embodiments may be implemented as a sequence of steps executing in the server 1830, and as interconnected machine modules within the system 1800. The implementation is a matter of choice and can depend on performance of the system 1800 implementing the embodiments. As such, the logical operations constituting said example versions of the embodiments are referred to for e.g., as operations, steps or modules.

Similar to a server 1830 described above, a client device 1801 can include a processor, memory, storage device, display, input device and communication interface (e.g., e-mail interface) for connecting the client device to the Internet 1828, the ISP, or LAN 1822, for communication with the servers 1830.

The system 1800 can further include computers (e.g., personal computers, computing nodes) 1805 operating in the same manner as client devices 1801, where a user can utilize one or more computers 1805 to manage data in the server 1830.

Figure 8:
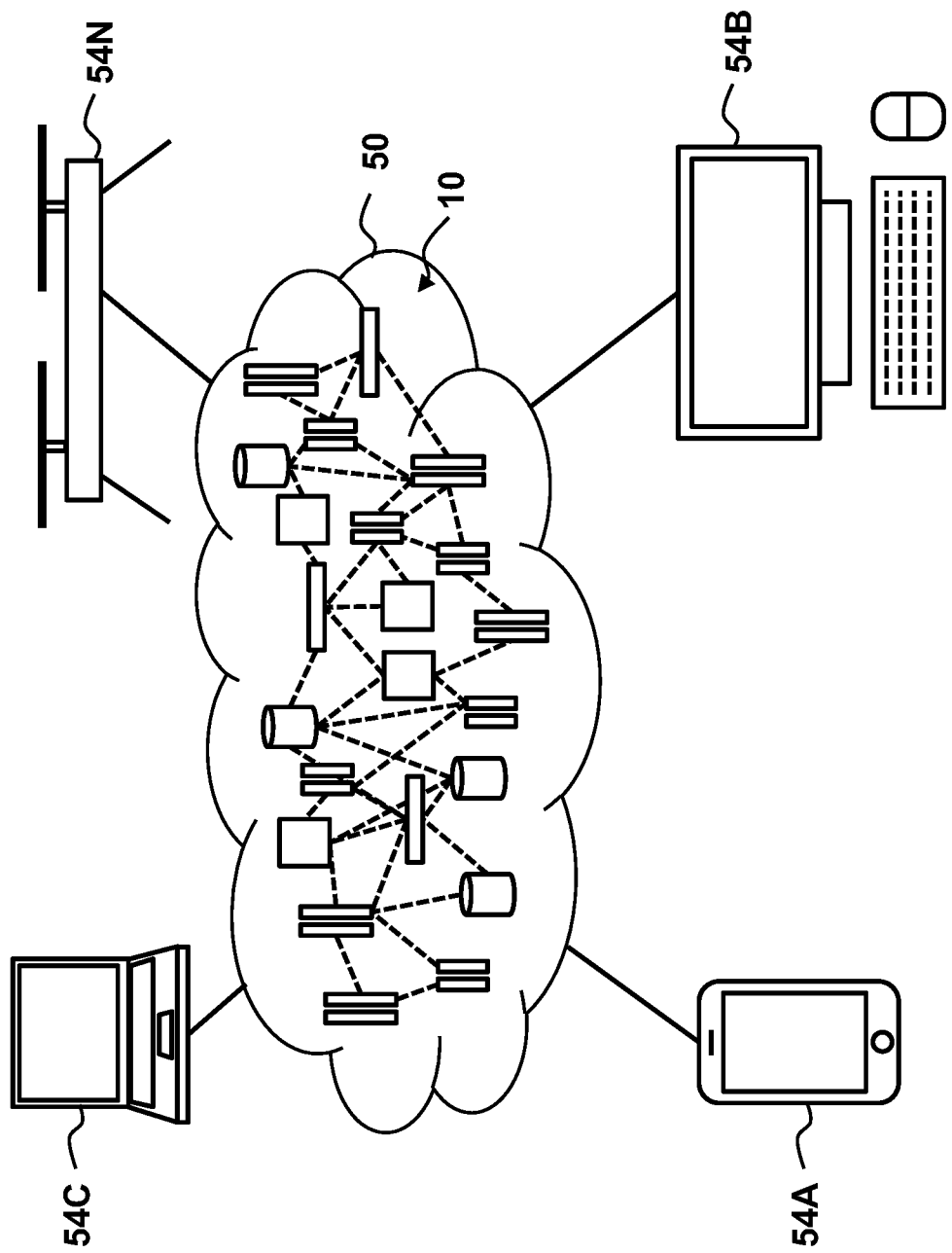
FIG. 8 depicts a cloud-computing environment for implementing an embodiment of the system and process disclosed herein, according to one embodiment.

Referring now to FIG. 8, illustrative cloud computing environment 50 is depicted. As shown, cloud computing environment 50 comprises one or more cloud computing nodes 10 with which local computing devices used by cloud consumers, such as, for example, personal digital assistant (PDA), smartphone, smart watch, set-top box, video game system, tablet, mobile computing device, or cellular telephone 54A, desktop computer 54B, laptop computer 54C, and/or unmanned aerial system (UAS) 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 10 and cloud computing environment 50 can communicate with any type of computerized device over any type of network and/or network addressable connection (e.g., using a web browser).

Figure 9:
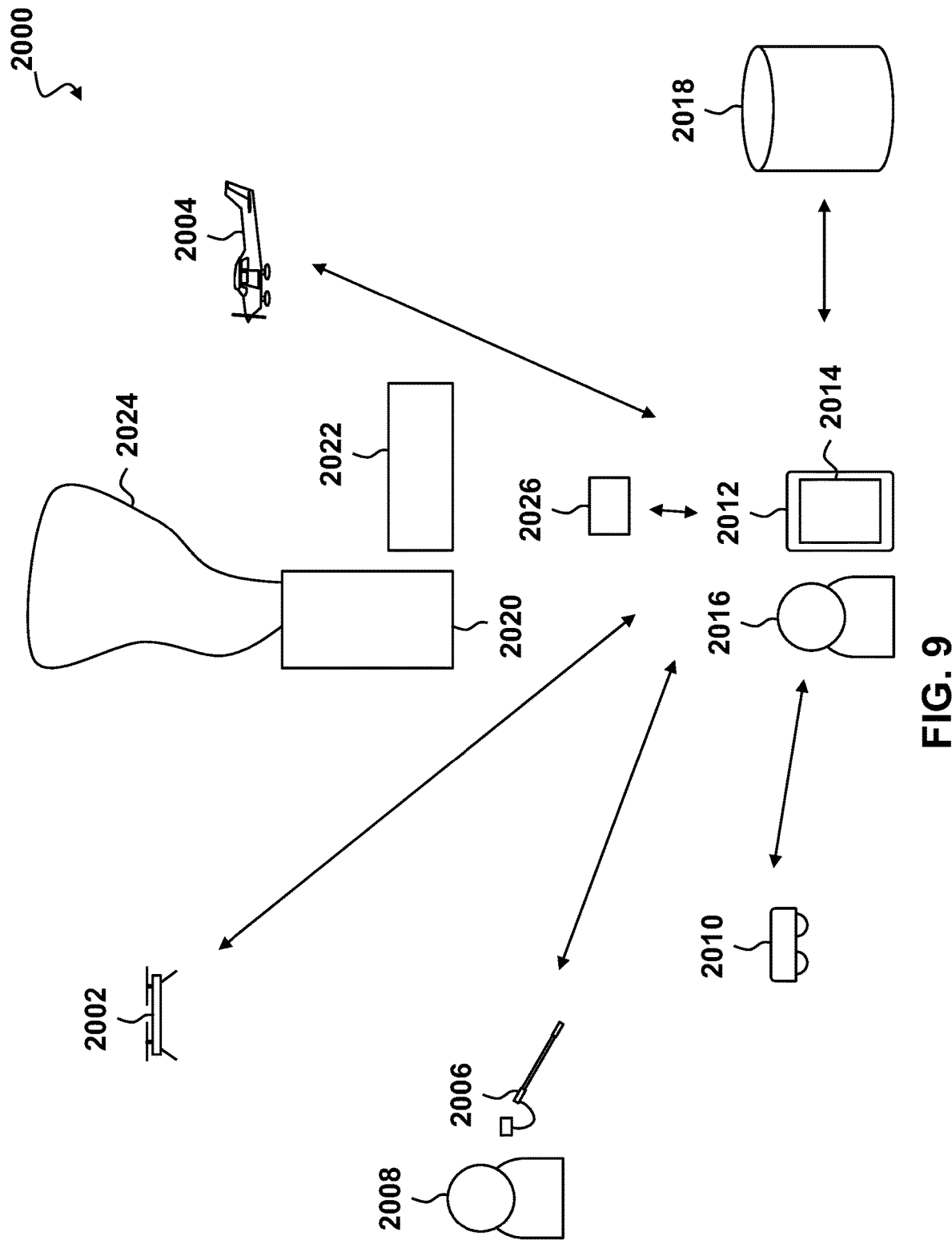
FIG. 9 depicts a system for detecting trace gasses, according to one embodiment.

FIG. 9 depicts a system 2000 for detecting trace gasses, according to one embodiment. The system may include one or more trace gas sensors located in one or more vehicles 2002, 2004, 2006, 2010. The one or more trace gas sensors may detect elevated trace gas concentrations from one or more potential gas sources 2020, 2022, such as a holding tank, pipeline, or the like. The potential gas sources 2020, 2022 may be part of a large facility, a small facility, or any location. The potential gas sources 2020, 2022 may be clustered and/or disposed distal from one another. The one or more trace gas sensors may be used to detect and quantify leaks of toxic gases, e.g., hydrogen disulfide, or environmentally damaging gases, e.g., methane, sulfur dioxide) in a variety of industrial and environmental contexts. Detection and quantification of these leaks are of interest to a variety of industrial operations, such as oil and gas, chemical production, and painting. Detection and quantification of leaks is also of value to environmental regulators for assessing compliance and for mitigating environmental and safety risks. In some embodiments, the at least one trace gas sensor may be configured to detect methane. In other embodiments, the at least one trace gas sensor may be configured to detect sulfur oxide, such as SO, SO2, SO3, S7O2, S6O2, S2O2, and the like. A trace gas leak 2024 may be present in a potential gas source 2020. The one or more trace gas sensors may be used to identify the trace gas leak 2024 and/or the source 2020 of the trace gas leak 2024 so that corrective action may be taken.

The one or more vehicles 2002, 2004, 2006, 2010 may include an unmanned aerial vehicle (UAV) 2002, an aerial vehicle 2004, a handheld device 2006, and a ground vehicle 2010. In some embodiments, the UAV 2002 may be a quadcopter or other device capable of hovering, making sharp turns, and the like. In other embodiments, the UAV 2002 may be a winged aerial vehicle capable of extended flight time between missions. The UAV 2002 may be autonomous or semi-autonomous in some embodiments. In other embodiments, the UAV 2002 may be manually controlled by a user. The aerial vehicle 2004 may be a manned vehicle in some embodiments. The handheld device 2006 may be any device having one or more trace gas sensors operated by a user 2008. In one embodiment, the handheld device 2006 may have an extension for keeping the one or more trace gas sensors at a distance from the user 2008. The ground vehicle 2010 may have wheels, tracks, and/or treads in one embodiment. In other embodiments, the ground vehicle 2010 may be a legged robot. In some embodiments, the ground vehicle 2010 may be used as a base station for one or more UAVs 2002. In some embodiments, one or more aerial devices, such as the UAV 2002, a balloon, or the like, may be tethered to the ground vehicle 2010. In some embodiments, one or more trace gas sensors may be located in one or more stationary monitoring devices 2026. The one or more stationary monitoring devices may be located proximate one or more potential gas sources 2020, 2022. In some embodiments, the one or more stationary monitoring devices may be relocated.

The one or more vehicles 2002, 2004, 2006, 2010 and/or stationary monitoring devices 2026 may transmit data including trace gas data to a ground control station (GCS) 2012. The GCS may include a display 2014 for displaying the trace gas concentrations to a GCS user 2016. The GCS user 2016 may be able to take corrective action if a gas leak 2024 is detected, such as by ordering a repair of the source 2020 of the trace gas leak. The GCS user 2016 may be able to control movement of the one or more vehicles 2002, 2004, 2006, 2010 in order to confirm a presence of a trace gas leak in some embodiments.

In some embodiments, the GCS 2012 may transmit data to a cloud server 2018. In some embodiments, the cloud server 2018 may perform additional processing on the data. In some embodiments, the cloud server 2018 may provide third party data to the GCS 2012, such as wind speed, temperature, pressure, weather data, or the like.

Figure 10:
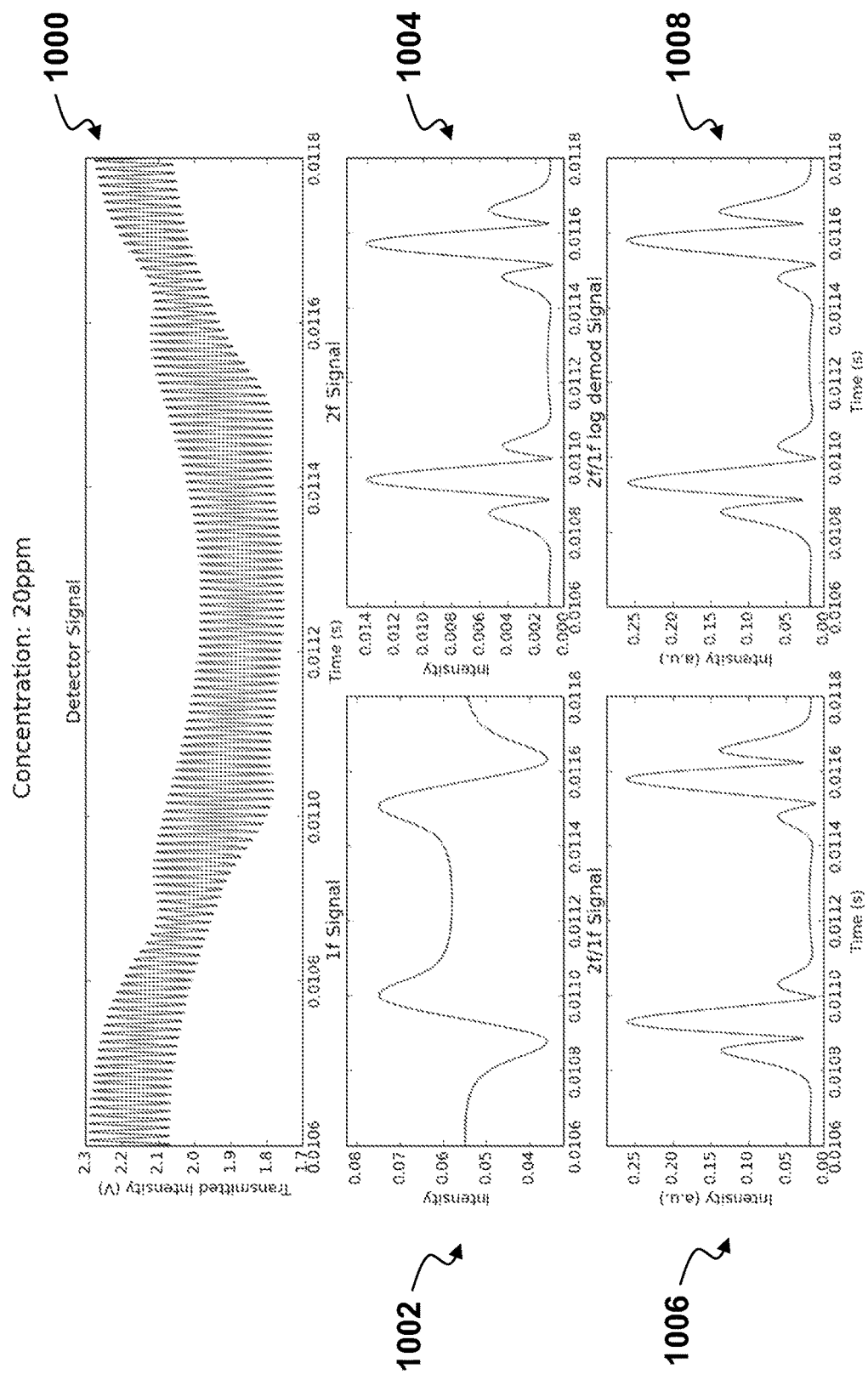
FIG. 10 depicts detector signals at varying stages of processing, according to one embodiment.
Figure 11A:
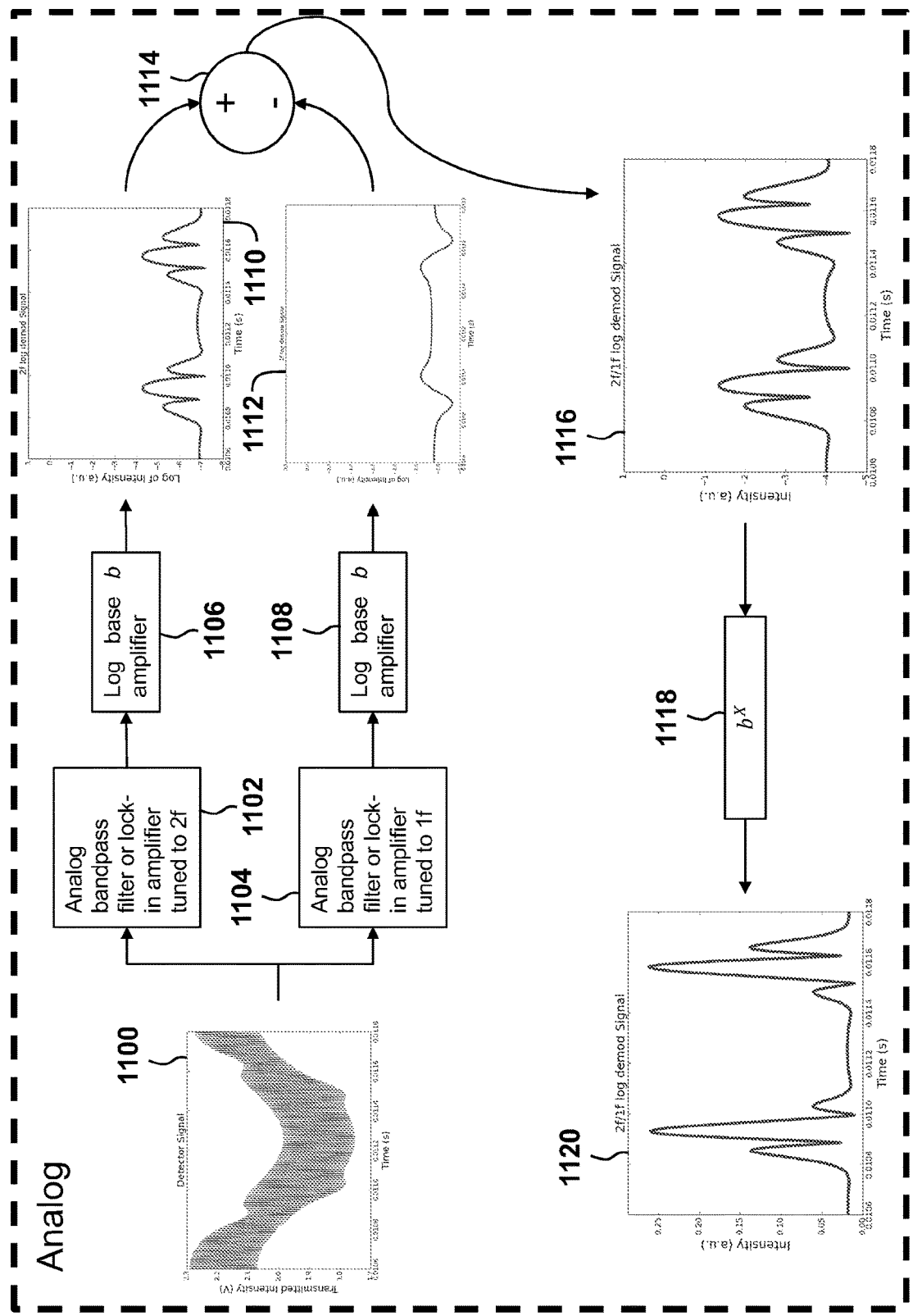
FIGS. 11A-11H depict high-level flowcharts of systems for signal processing performed in analog and/or digital, according to one embodiment.
Figure 11B:
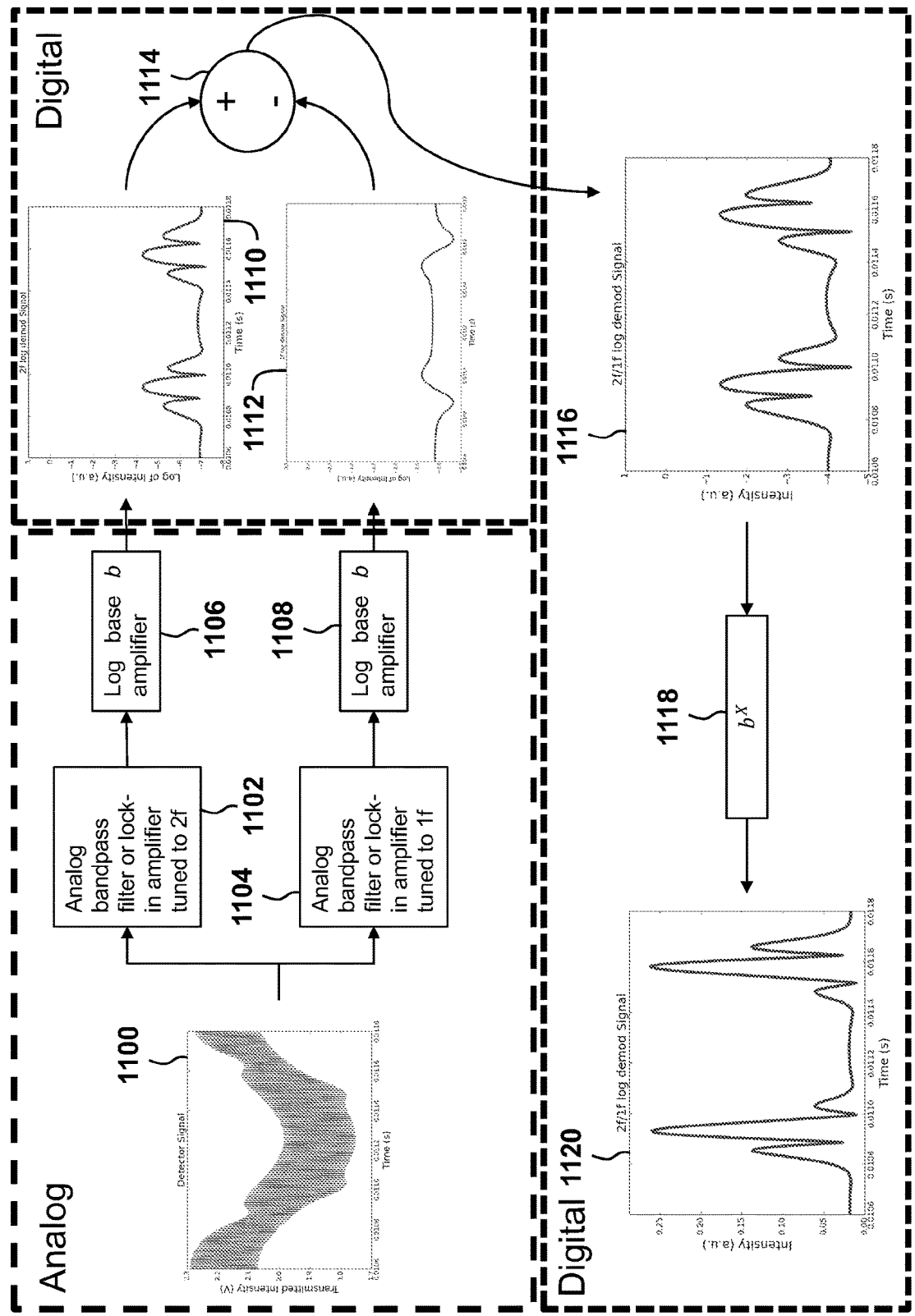
Figure 11C:
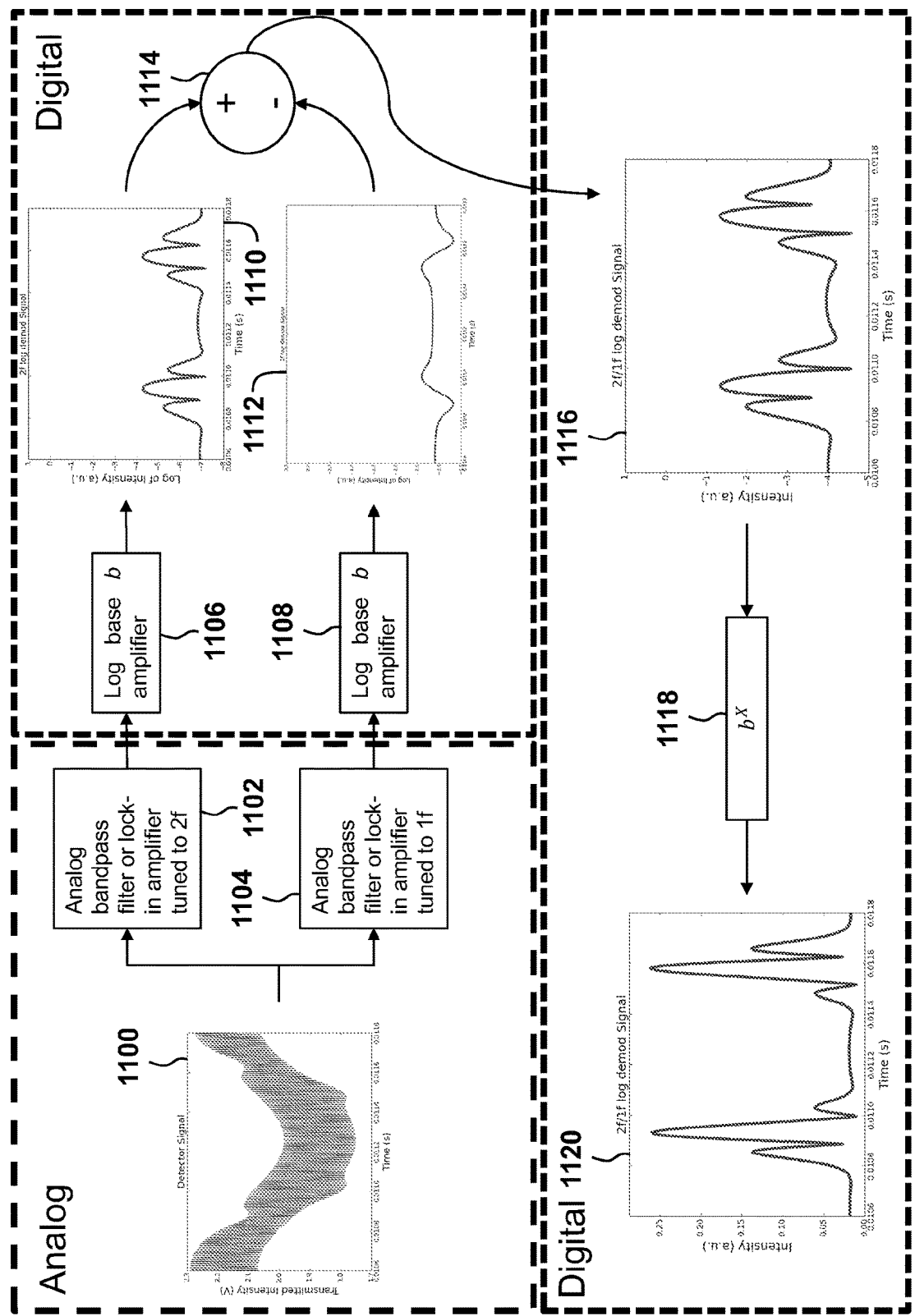
Figure 11D:
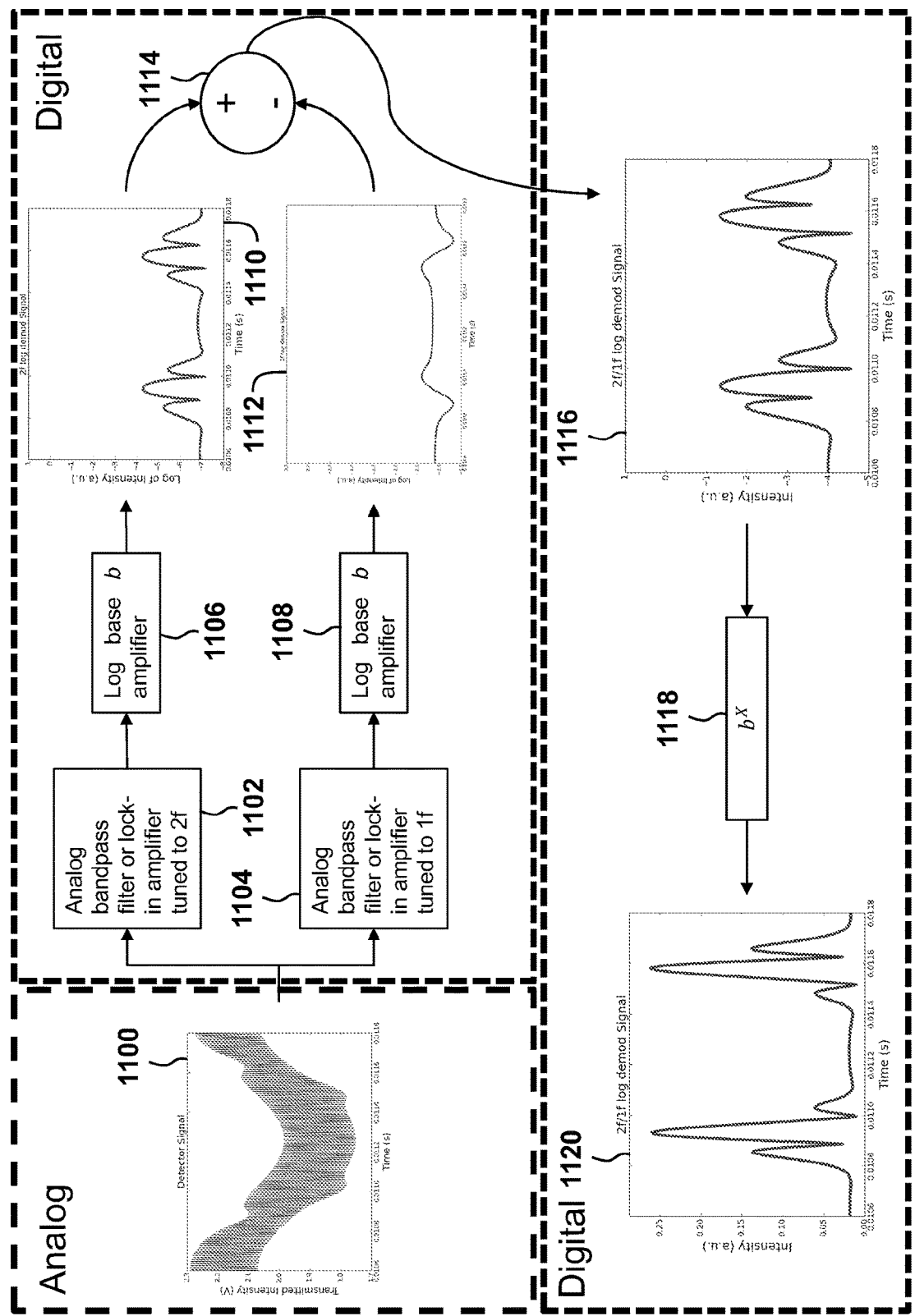
Figure 11E:
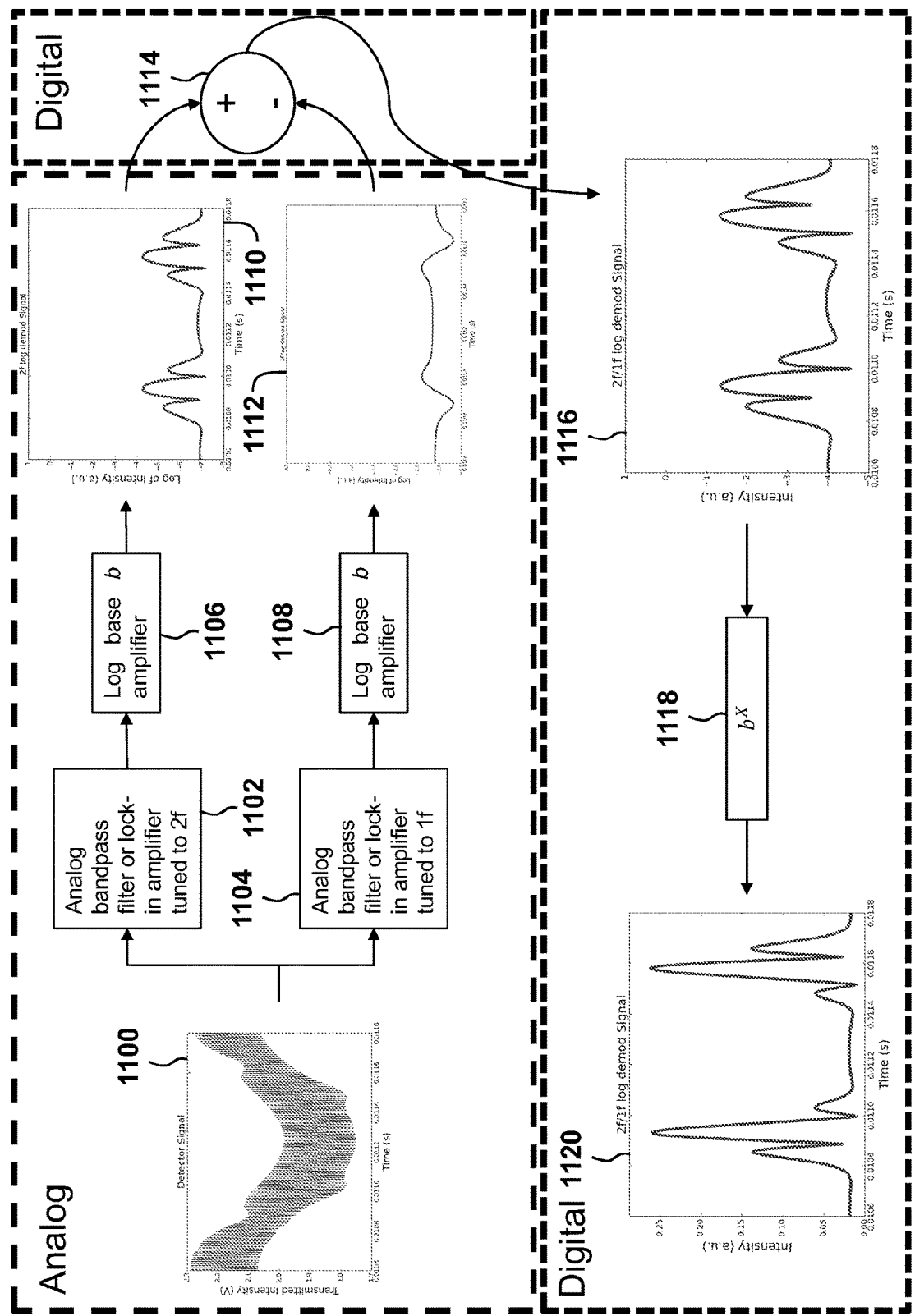
Figure 11F:
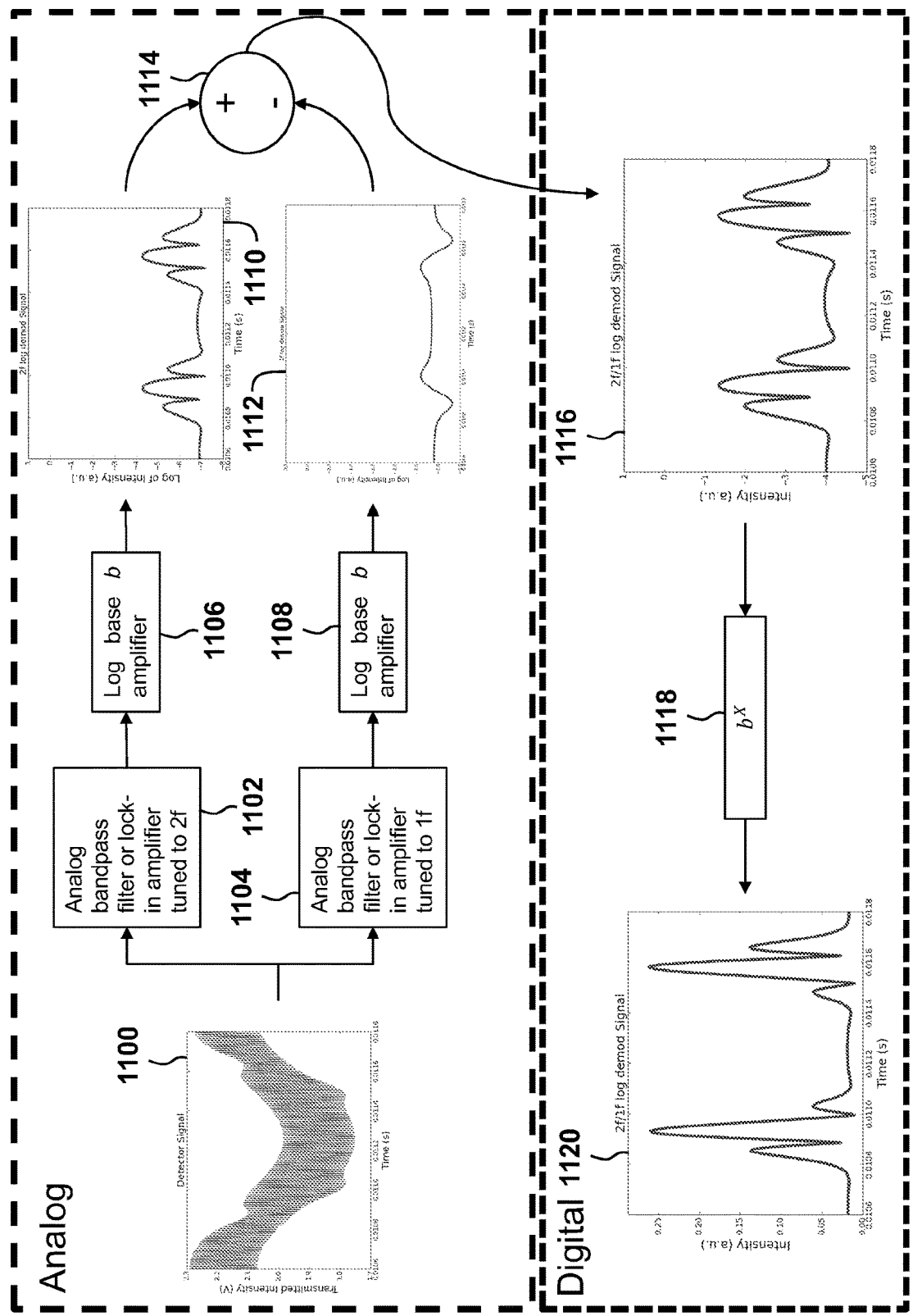
Figure 11G:
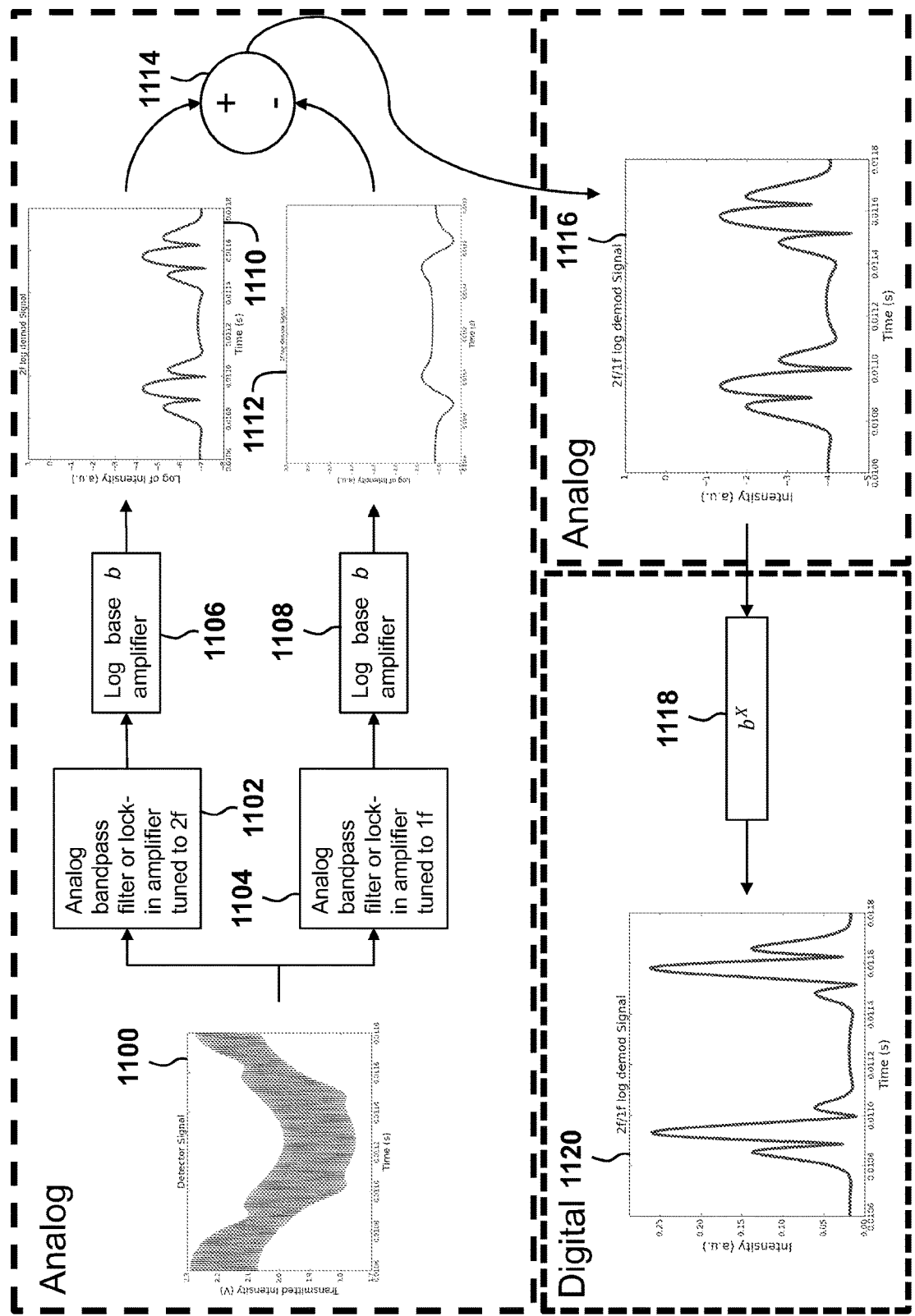
Figure 11H:
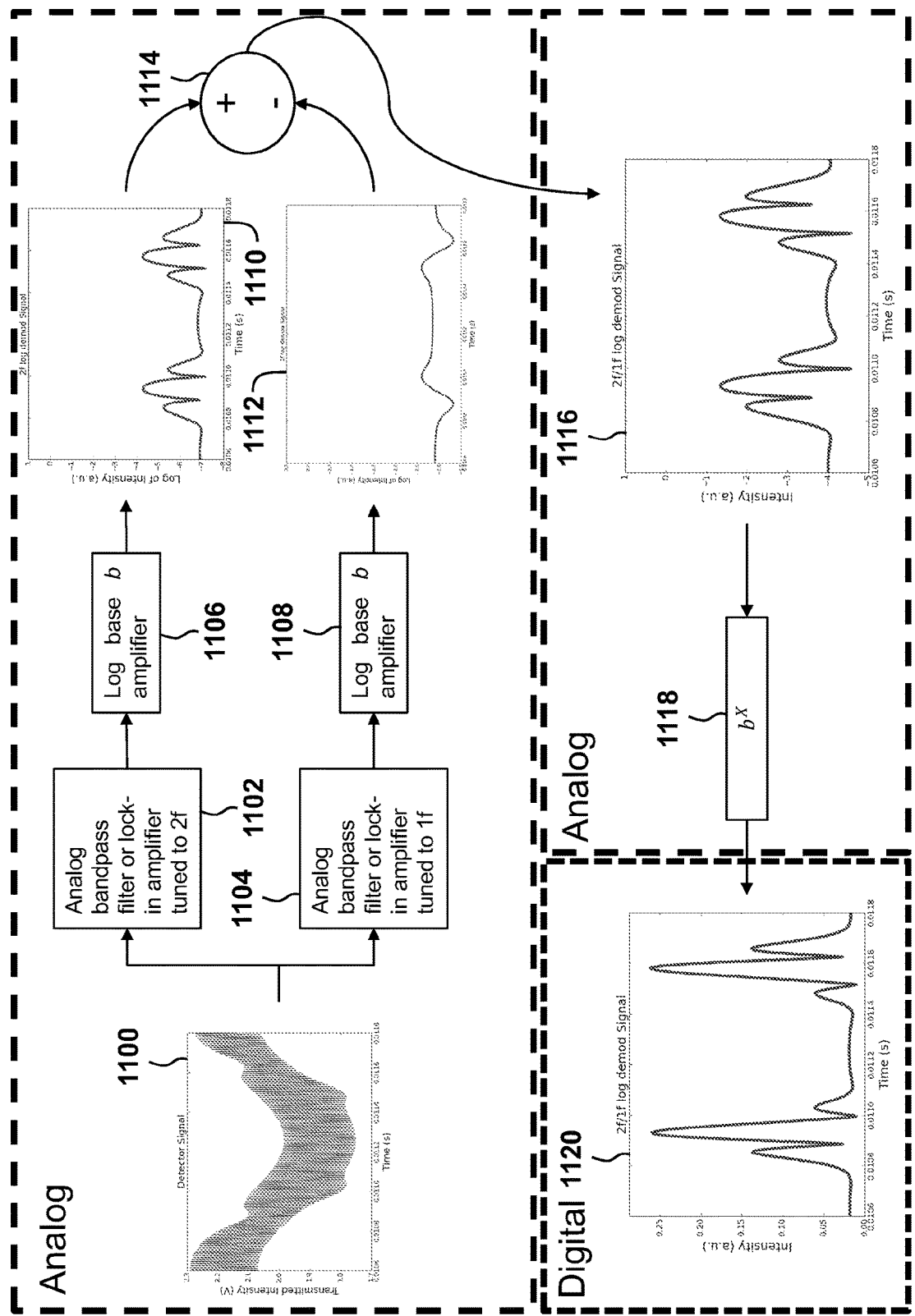

FIG. 10 depicts detector signals at varying stages of processing, according to one embodiment. A raw detector signal 1000 shows the signal plotted over Time (s) and Transmitted intensity (V). The raw detector signal 1000 may correspond to the signal (101, FIGS. 1 and 3A-3B). The raw detector signal 1000 is for a laser being scanned at a specific frequency, such as 800 Hz, and modulated at another frequency, such as 100 kHz, with an amplitude of three wavenumbers. A demodulated 1f signal 1002 shows the signal plotted over Time and Intensity. A demodulated 2f signal 1004 shows the signal plotted over Time and Intensity. A 2f/1f signal 1006 shows the signal plotted over Time and Intensity. The 2f/1f signal 1006 shows the 2f signal normalized by the 1f signal via dot product of the 2f signal by the inverse of the 1f signal. In some embodiments, the 2f/1f signal 1006 may divide each 2f index by the same 1f index. A 2f/1f demodulated signal 1008 shows the signal plotted over Time and Intensity. The 2f/1f demodulated signal 1008 may correspond to the 2f/1f signal (127, FIGS. 3A-3B).

FIGS. 11A-11H depict high-level flowcharts of systems for signal processing performed in analog and/or digital, according to one embodiment. Analog processing is shown through elements contained within longer dashed lines. Digital processing is shown through elements contained within shorter dashed lines. In a preferred embodiment, all of the signal processing, up to the concentration calculation, may be performed in analog. Maintaining the signal processing in analog may require less processing power in some embodiments.

A detector signal 1100 may correspond to the signal (101, FIGS. 1 and 3A-3B). An analog bandpass filter or lock-in amplifier tuned to 2f 1102 receives the detector signal 1100. 2f is the second harmonic, which is the modulation frequency. A first log base b amplifier 1106 receives the processed signal from the analog bandpass filter or lock-in amplifier tuned to 2f 1102. The first log base b amplifier 1106 outputs a 2f log demodulation signal 1110.

An analog bandpass filter or lock-in amplifier tuned to 1f 1104 also receives the detector signal 1100. 1f is the first harmonic, which is the modulation frequency. A second log base b amplifier 1108 receives the processed signal from the analog bandpass filter or lock-in amplifier tuned to 1f 1104. The second log base b amplifier 1108 outputs a 1f log demodulation signal 1112.

A differential amplifier 1114 subtracts the 2f log demodulation signal 1110 and the 1f log demodulation signal 1112 to output a 2f/1f log demodulation signal 1116. The 2f/1f log demodulation signal 1116 is processed by $b^x$ 1118 where X is the input signal and b is the base of a log amplifier. The output signal 1120 of $b^x$ is a 2f/1f log demodulation signal.

Figure 12:
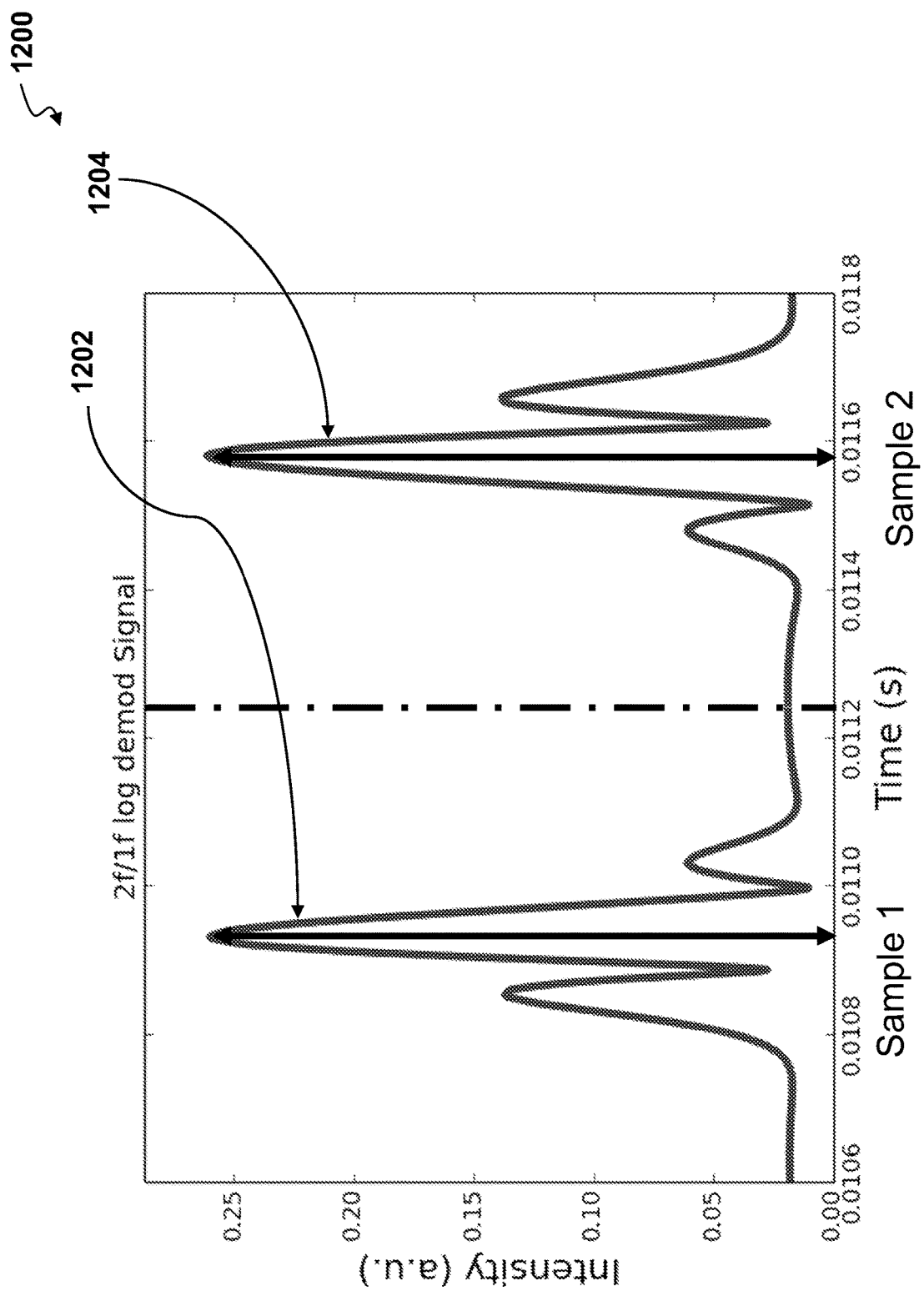
FIG. 12 depicts a method for determining a species concentration, according to one embodiment.

FIG. 12 depicts a method 1200 for determining a species concentration, according to one embodiment. A y species concentration 1202, 1204 is shown on the 2f/1f log demodulation signal for two samples, sample 1 and sample 2. The species concentration may be determined using $x=y*a+b$. Where x is species concentration, y is the signal measurement at the peak wavelength (in this case a function of time due to scanning of laser current), and a and b are scalars determined through a calibration process.

Figure 13:
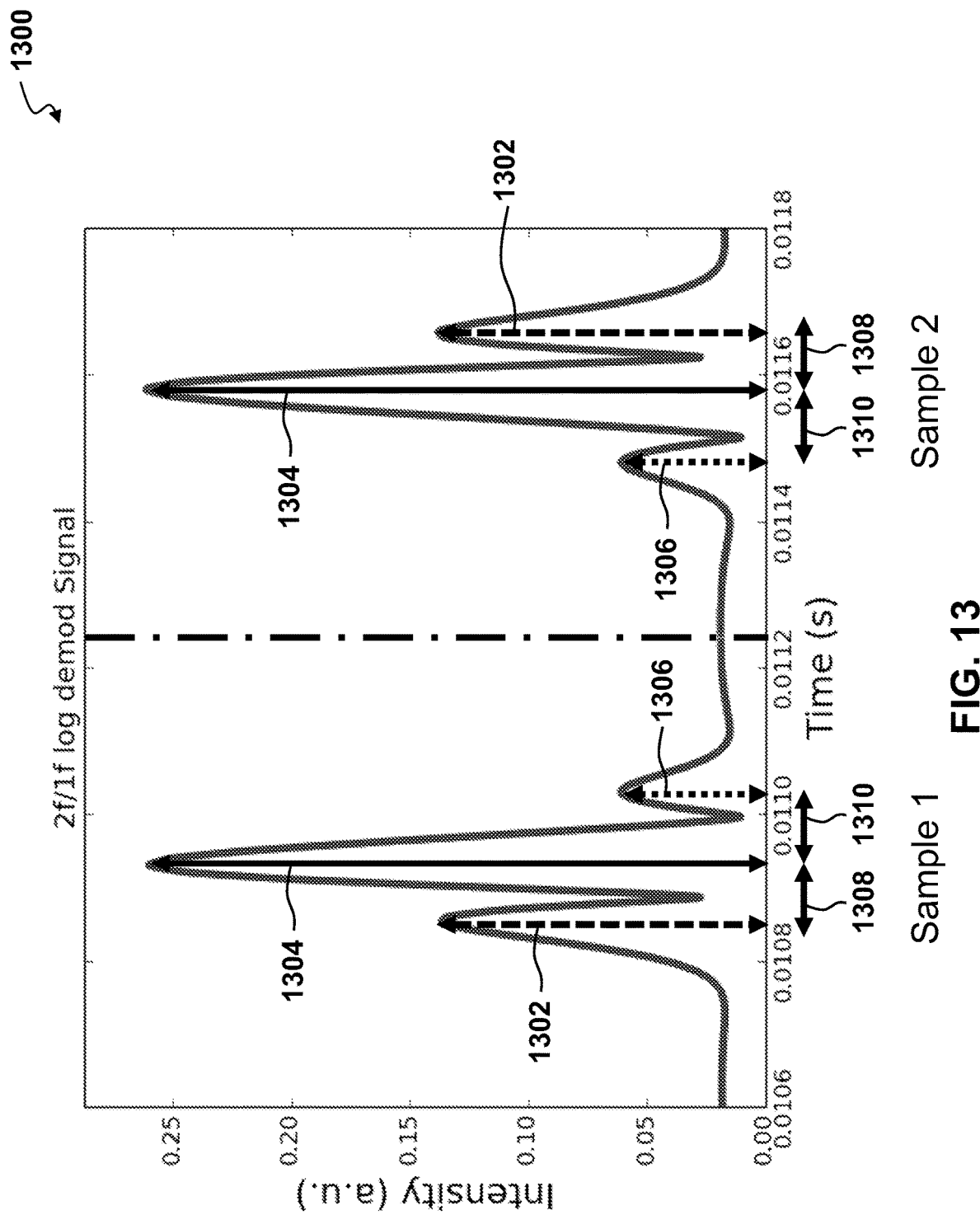
FIG. 13 depicts another method for determining a species concentration, according to one embodiment.

FIG. 13 depicts another method 1300 for determining a species concentration, according to one embodiment. One or more measurements 1302, 1304, 1306, 1308, 1310 of the intensity over times for the two samples may be used to determine a species concentration by using these one or more measurements 1302, 1304, 1306, 1308, 1310 in a look-up table.

Figure 14:
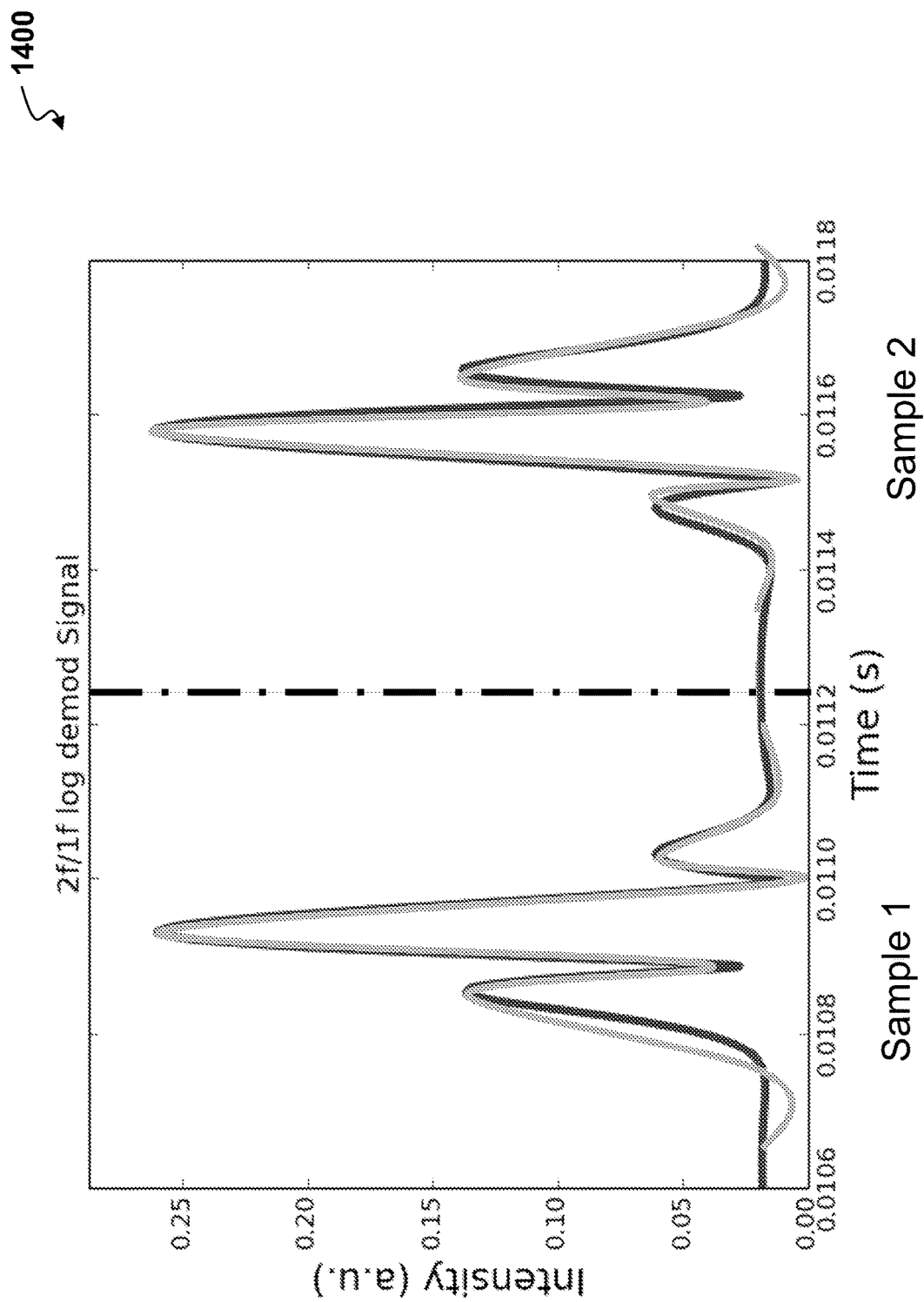
FIG. 14 depicts another method for determining a species concentration, according to one embodiment.

FIG. 14 depicts another method 1400 for determining a species concentration, according to one embodiment. The method 1400 may use a nonlinear regression and high-resolution transmission molecular absorption (HITRAN) database on each sample to determine species concentration given temperature and pressure—or assume a fixed temperature and pressure, such as standard temperature and pressure.

Figure 15:
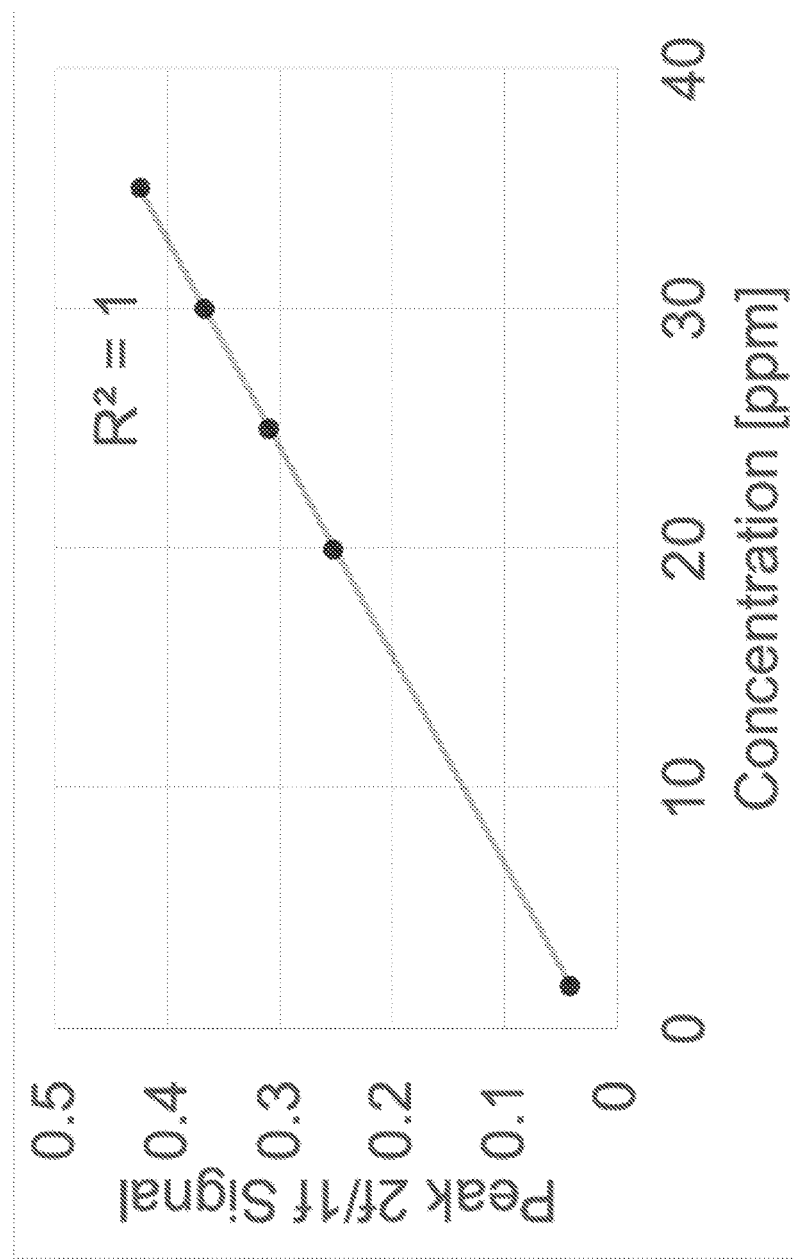
FIG. 15 depicts a graph showing a linearity between peak 2f/1f measured signal and species concentration, according to one embodiment.

FIG. 15 depicts a graph 1500 showing a linearity between peak 2f/1f measured signal and species concentration, according to one embodiment.

What is claimed is:

1. A system comprising:
a first filter, wherein the first filter has a central frequency of nf which is a harmonic of frequency f, and wherein the first filter is configured to receive and filter an analog signal to generate a first filtered analog signal;
a second filter, wherein the second filter has a central frequency of f, wherein the second filter is configured to receive and filter the analog signal, to generate a second filtered analog signal;
a first demodulation converter configured to convert the first filtered analog signal to a first demodulated signal;
a second demodulation converter configured to convert the second filtered analog signal to a second demodulated signal; and
a differentiator configured to subtract the first demodulated signal from the second demodulated signal to generate a differential signal.

2. The system of claim 1, further comprising:
an inverse converter configured to determine an inverse demodulation of the differential signal to return an nf/1f signal.

3. The system of claim 1, wherein the first filter is a first band-pass filter, wherein the second filter is a second band-pass filter, and wherein the analog signal is a detector signal.

4. The system of claim 1, wherein the first band-pass filter has a central frequency of one of an integer order harmonic frequency greater than two.

5. The system of claim 1, further comprising a single power supply, wherein the single power supply does not comprise differential supply voltages.

6. The system of claim 1, further comprising:
a first low-pass filter, wherein the first low-pass filter applies a low-pass filter to the first demodulated signal from the first demodulation converter; and
a second low-pass filter, wherein the second low-pass filter applies a low-pass filter to the second demodulated signal from the second demodulation converter.

7. The system of claim 1, wherein the analog signal is at least one of: an optical detector signal and a photo detector signal, and wherein the analog signal comprises a measurement of gas absorption.

8. The system of claim 1, wherein the first demodulation converter is a first logarithmic amplifier, and wherein the second demodulation converter is a second logarithmic amplifier.

9. The system of claim 1, wherein the first demodulation converter is a first peak detector, and wherein the second demodulation converter is a second peak detector.

10. A method comprising:
filtering an analog signal at a first filter, wherein the first filter has a central frequency of of which is a harmonic of frequency f;
generate a first filtered analog signal from the filtered analog signal at the first band-pass filter;
filtering the analog signal at a second filter wherein the second filter has a central frequency of f;
generate a second filtered analog signal from the filtered analog signal at the first band-pass filter;
convert the first filtered analog signal to a first demodulated signal by a first demodulation converter;
applying the second filtered analog signal to a second demodulated signal by a second demodulation converter; and
generate a differential signal by subtracting the first demodulated signal from the second demodulated signal by a differentiator.

11. The method of claim 10, further comprising:
determining an inverse demodulation of the differential signal to return an nf/1f signal.

12. The method of claim 10, wherein the first filter is a first band-pass filter, wherein the second filter is a second band-pass filter, and wherein the analog signal is a detector signal.

13. The method of claim 10, further comprising:
powering, via a single power supply, a circuit comprising the first band-pass filter, the second band-pass filter, the first demodulation converter, the second demodulation converter, and the differentiator, wherein the single power supply does not comprise differential supply voltages.

14. The method of claim 10, further comprising
applying a low-pass filter to the first applied signal from the first demodulation converter; and
applying a low-pass filter to the second applied signal from the second demodulation converter.

15. The method of claim 10, wherein the determined inverse logarithm is not influenced by a phase of the analog signal.

16. A system comprising:
a first band-pass filter, wherein the first band-pass filter is configured to receive and filter a detector signal, and wherein the first band-pass filter has a central frequency of nf which is a harmonic of frequency f;
a second band-pass filter, wherein the second band-pass filter is configured to receive and filter the detector signal, and wherein the second band-pass filter has a central frequency of f;
a first demodulation converter, wherein the first demodulation converter is configured to apply the filtered detector signal from the first band-pass filter;
a second demodulation converter, wherein the second demodulation converter is configured to apply the filtered detector signal from the second band-pass filter; and
a differentiator, wherein the differentor is configured to subtract the applied signal from the first demodulation converter from the applied signal from the second demodulation converter.

17. The system of claim 16, further comprising:
an inverse converter configured to determine an inverse demodulation of the subtracted signal to return an nf/1f signal.

18. The system of claim 16, further comprising:
a first low-pass filter applied to the first applied signal from the first demodulation converter; and
a second low-pass filter applied to the second applied signal from the second demodulation converter.

19. The system of claim 16, wherein the detector signal is at least one of: an optical detector signal and a single signal.

20. The system of claim 16, wherein the detector signal comprises at least one of: a tunable diode laser being scanned at a specific frequency and modulated at another frequency with an amplitude of three wavenumbers and a measurement of gas absorption.

\* \* \* \* \*